(12) United States Patent
Makita

(10) Patent No.: US 7,262,469 B2
(45) Date of Patent: Aug. 28, 2007

(54) SEMICONDUCTOR DEVICE AND METHOD FOR MANUFACTURING THE SAME

(75) Inventor: Naoki Makita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 10/734,312

(22) Filed: Dec. 15, 2003

(65) Prior Publication Data

US 2004/0124469 A1 Jul. 1, 2004

(30) Foreign Application Priority Data

Dec. 24, 2002 (JP) ............... 2002-371422

(51) Int. Cl.
*H01L 23/62* (2006.01)
(52) U.S. Cl. .............. 257/357; 257/347; 257/66; 257/69; 257/E29.022
(58) Field of Classification Search ........... 257/347, 257/349, 357, 64, 68, 69, E29.022
See application file for complete search history.

(56) References Cited

U.S. PATENT DOCUMENTS

| 5,693,959 A * | 12/1997 | Inoue et al. ........... 257/66 |
| 6,013,930 A | 1/2000 | Yamazaki et al. |
| 6,773,996 B2 | 8/2004 | Suzawa et al. |
| 2002/0068388 A1* | 6/2002 | Murakami et al. ....... 438/149 |
| 2002/0100937 A1* | 8/2002 | Yamazaki et al. ....... 257/347 |
| 2002/0102823 A1* | 8/2002 | Yamaguchi et al. ...... 438/487 |
| 2002/0127827 A1* | 9/2002 | Yamazaki et al. ....... 438/486 |
| 2003/0038321 A1* | 2/2003 | Sakakura et al. ....... 257/347 |
| 2003/0080384 A1* | 5/2003 | Takahashi et al. ....... 257/347 |

FOREIGN PATENT DOCUMENTS

| JP | 08-213637 | 8/1996 |
| JP | 10-092745 | 4/1998 |
| JP | 10-106951 | 4/1998 |
| JP | 10-200120 | 7/1998 |
| JP | 11-097708 A | 4/1999 |
| JP | 11-186552 | 7/1999 |
| JP | 2000-260993 | 9/2000 |
| JP | 2001-196590 A | 7/2001 |
| JP | 2001-308334 A | 11/2001 |
| JP | 2002-083805 A | 3/2003 |

OTHER PUBLICATIONS

Official Communication dated Sep. 30, 2005, Issued in the corresponding Chinese Patent Application No. 200310123024.8.
Official Communication issued in the corresponding Japanese Application No. 2002-371422, mailed on Jul. 11, 2006.

* cited by examiner

*Primary Examiner*—N. Drew Richards
(74) *Attorney, Agent, or Firm*—Keating & Bennett, LLP

(57) ABSTRACT

A semiconductor device includes a thin film transistor including a semiconductor layer that includes a channel region, a source region and a drain region, a gate insulating film provided on the semiconductor layer, and a gate electrode for controlling the conductivity of the channel region, wherein the surface of the semiconductor layer includes a minute protruding portion, and the side surface inclination angle of the gate electrode is larger than the inclination angle of the protruding portion of the semiconductor layer.

38 Claims, 15 Drawing Sheets

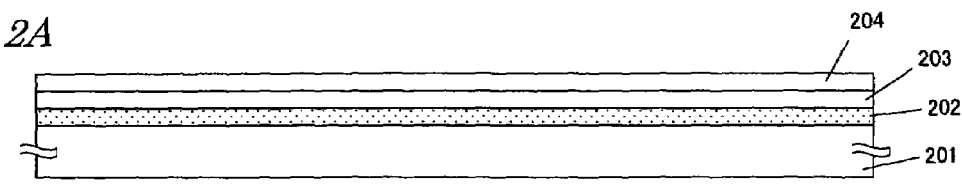
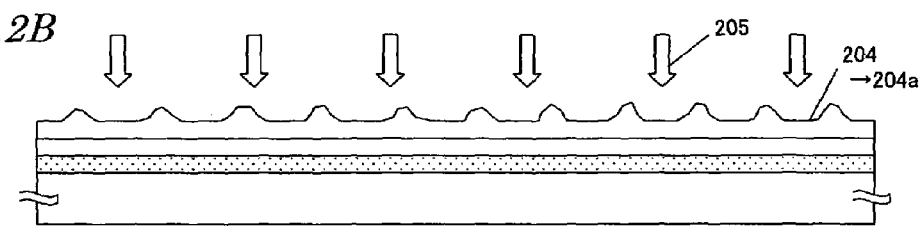
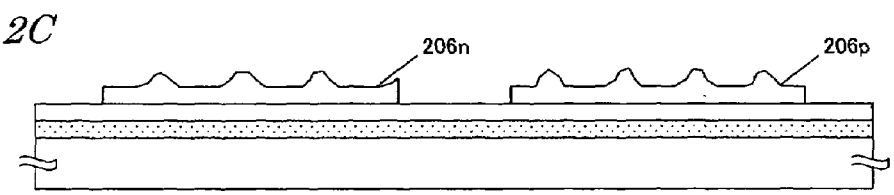
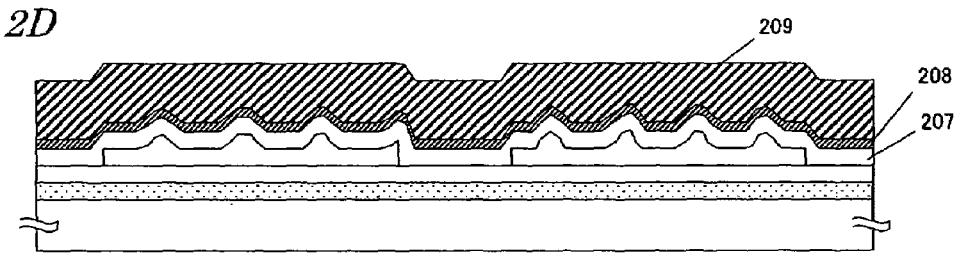
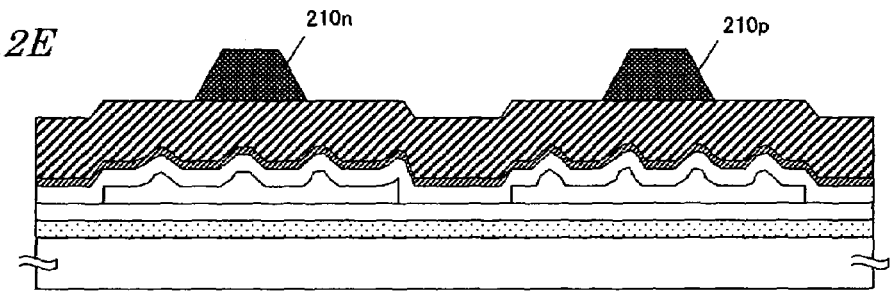
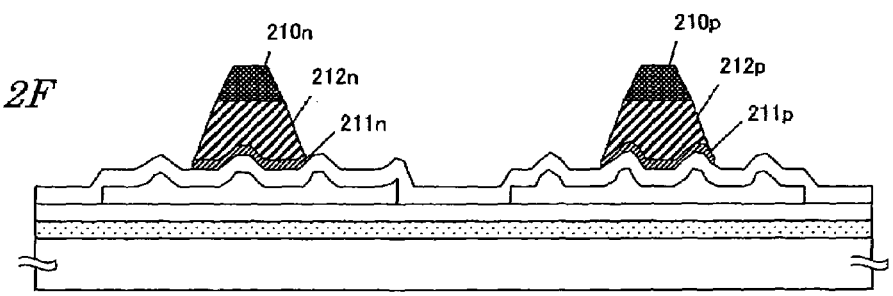

SEMICONDUCTOR DEVICE AND METHOD FOR MANUFACTURING THE SAME

BACKGROUND OF THE INVENTION

1. Field of the Invention

The present invention relates to a semiconductor device including thin film transistors (TFTs), a method for manufacturing the same, and a semiconductor manufacturing apparatus. More particularly, the present invention relates to a semiconductor device in which the active region is formed from a crystalline semiconductor film obtained by crystallizing an amorphous semiconductor layer, and a method for manufacturing the same.

2. Description of the Related Art

In recent years, attempts have been made in the art to form high-performance semiconductor elements on an insulative substrate such as a glass substrate or an insulating film, aiming at realization of liquid crystal display devices and organic EL display devices having larger sizes and higher resolutions, contact image sensors operating at higher speeds with higher resolutions, three-dimensional ICs, etc. Particularly, a type of liquid crystal display device having the pixel section and the driving circuit on the same substrate is finding its use in various household appliances, in addition to a monitor of a personal computer (PC). For example, liquid crystal displays are used as television sets, replacing CRTs (Cathode-Ray Tubes), and front projectors are used for home entertainment applications such as for watching movies and for playing video games. Thus, the market for liquid crystal display devices has been growing at a remarkable rate. Moreover, system-on-panel devices have been developed actively, in which logic circuits such as a memory circuit and a clock generation circuit are formed on a glass substrate.

Displaying high-resolution images means an increase in the amount of data to be written to pixels, and the data needs to be written within a short time. Otherwise, it is not possible to display a moving picture that has a very large amount of data for high-definition display. Therefore, TFTs used in a driving circuit are required to operate at a high speed. In order to achieve high-speed operations, there is a demand for forming the TFTs using a crystalline semiconductor layer having a desirable crystallinity, with which it is possible to obtain a high field-effect mobility.

A commonly-known method for obtaining a desirable crystalline semiconductor film on a glass substrate involves irradiating an amorphous semiconductor film with laser light such as excimer laser light so as to instantaneously melt/solidify and thus crystallize the amorphous semiconductor film. Another method that has been developed in the art involves adding a metal element capable of promoting crystallization to an amorphous semiconductor film, which is then subjected to a heat treatment. With this method, a desirable semiconductor film having a uniform crystal orientation can be obtained through a heat treatment performed at a lower temperature and for a shorter time than other conventional methods. In this method, laser light irradiation is often used in combination in order to further improve the crystallinity, by irradiating a crystalline semiconductor film obtained through a heat treatment with laser light so as to partially melt/solidify and thus recrystallized the crystalline semiconductor film, thereby reducing the crystal defects therein and obtaining a crystalline semiconductor film of a higher quality.

However, it has been found that with such a method of irradiating an amorphous or crystalline semiconductor film with laser light so as to melt/solidify and thus crystallize or recrystallize the amorphous or crystalline semiconductor film, surface irregularities are formed on the surface of the semiconductor film. The surface irregularities are formed as follows. After a semiconductor film is once melted by laser light irradiation, crystal nuclei are formed, and the melted portions are gradually solidified starting from the crystal nuclei. Then, the crystal grain boundary portions, which are solidified lastly, are raised in a mountain-range-like shape (where two crystal grains meet) or in a mountain-like shape (at multiple points where three or more crystal grains meet), due to the difference in volumetric expansion coefficient between a melted portion and a solidified portion. Those portions on the surface of a semiconductor film that are raised in a mountain-range-like shape or in a mountain-like shape will be hereinafter referred to as "protruding portions" or "ridges". With a top-gate thin film transistor, the ridge is present at the channel interface between the semiconductor film and the gate insulating film, thereby deteriorating the interface characteristics and the field-effect mobility. Furthermore, an electric field is localized at the tip of a ridge. Thus, it is believed that a ridge deteriorates the voltage endurance of the gate insulating film, and lowers the overall device reliability including the hot-carrier resistance.

Therefore, various methods have been developed in the art for reducing the surface irregularities/ridges of a semiconductor film. Japanese Laid-Open Patent Publication No. 8-213637 discloses a method in which a semiconductor film has an island-like shape with an inclined edge, after which the semiconductor film is irradiated with laser light, in an attempt to prevent the formation of protruding portions on the surface of the semiconductor film. Japanese Laid-Open Patent Publication No. 10-92745 discloses a method in which a natural oxide film on the surface of an amorphous silicon film is removed by dry etching, after which the amorphous silicon film is irradiated with laser light in a vacuum process. Japanese Laid-Open Patent Publication No. 10-106951 discloses a method in which the surface of a silicon film on which protruding portions have been formed through laser light irradiation is oxidized to reduce the surface irregularities utilizing the fact that the oxidization rate is higher at ridges. Japanese Laid-Open Patent Publication No. 10-200120 discloses a method in which surface irregularities formed through laser light irradiation are reduced by surface polishing. Japanese Laid-Open Patent Publication No. 11-186552 discloses a method in which surface irregularities formed through laser light irradiation are reduced by etching the surface of a semiconductor film.

All of these publications disclose methods for reducing ridges on the surface of a semiconductor film. As described above, one factor for the formation of ridges is the difference in volumetric expansion coefficient between a melted portion and a solidified portion in the process of melting/solidifying a semiconductor film. Therefore, physically speaking, it is difficult to improve the surface configuration by making changes in the process conditions, or the like. Thus, various methods have been proposed in the art as disclosed in the publications mentioned above.

However, the methods disclosed in the publications all increase the number of process steps and complicate the manufacturing apparatus, and the increase in the number of process steps inevitably increases the cost and decreases the production yield. Moreover, these publications aim at preventing the decrease in the channel interface characteristics, the field-effect mobility, the voltage endurance of the gate insulating film and the reliability of a top-gate thin film transistor due to the presence of ridges on the surface of the semiconductor film.

The present inventors quantitatively examined the influence of the presence of ridges on a thin film transistor, finding that the decrease in the channel interface characteristics, the field-effect mobility, the voltage endurance of the gate insulating film and the device reliability was not so significant. Needless to say, the surface irregularities on the semiconductor film should preferably be as small as possible. However, it has been found that the channel interface characteristics and the field-effect mobility, for example, are influenced significantly by the condition of the semiconductor film itself, i.e., the crystalline condition thereof, whereas the influence of ridges is negligible, comparatively speaking. It has been found that the voltage endurance of the gate insulating film and the device reliability are also influenced primarily by the bulk properties and the thickness of the gate insulating film itself, and the influence of ridges is not so significant when the thickness of the gate insulating film is 50 nm or more.

However, a new problem has been discovered by the inventors of the present application. The problem is related to the production yield, and is one that cannot be found except by a quantitative experiment. A top-gate thin film transistor (TFT) using a semiconductor layer having surface irregularities that is formed by laser irradiation normally exhibits Vg-Id characteristics as shown in FIG. 10B. In FIG. 10B, curves 10a and 10b show the Vg-Id characteristics for drain-source voltages of 8 V and 1 V, respectively. However, while normal TFTs exhibit characteristics as shown in FIG. 10B, there were some TFTs with Vg-Id (gate voltage-drain current) characteristics as shown in FIG. 10A at an occurrence rate on the order of 0.01% to 0.1%. In FIG. 10A, curves 10a and 10b show the Vg-Id characteristics for drain-source voltages of 8 V and 1 V, respectively. When a gate voltage is applied in the off-state direction in such TFTs, abnormal humped curves of leak current occur as indicated by an arrow X for lower voltage values. The leak current values in the humped portion are greater than those of normal TFTs for the same gate voltages by one or two orders of magnitude. As the gate voltage is further increased in the off-state direction, these TFTs exhibit leak current curves similar to those of normal TFTs. The occurrence of an off-state current in a TFT using a non-monocrystalline crystalline semiconductor film is commonly modeled with thermal excitation and tunneling via a trap level occurring due to crystal defects, etc., present near the center of the bandgap. However, the abnormal humped curves of leak current as described above cannot be explained with this model because the leak current increases as the gate voltage increases in the off-state direction.

In a liquid crystal display device, for example, such an abnormal off-state leak current may prevent a TFT for switching a pixel electrode from sufficiently holding a charge written to the pixel electrode, resulting in a point defect. In a driver circuit for driving a display section, such an abnormal off-state leak current may prevent a charge written to a bus line from being held in a sampling TFT such as an analog switch, resulting in a line defect. As a result, the production yield is lowered substantially.

SUMMARY OF THE INVENTION

In order to overcome the problems described above, preferred embodiments of the present invention provide a much more reliable semiconductor device and a method for manufacturing such a novel semiconductor device, by preventing the increase in the leak current while a TFT is off.

An inventive semiconductor device includes a thin film transistor including a semiconductor layer that includes a channel region, a source region and a drain region, a gate insulating film provided on the semiconductor layer, and a gate electrode for controlling a conductivity of the channel region, wherein a surface of the semiconductor layer includes a minute protruding portion, and a side surface inclination angle of the gate electrode is larger than an inclination angle of the protruding portion of the semiconductor layer.

Another inventive semiconductor device includes a thin film transistor including a semiconductor layer that includes a channel region, a source region and a drain region, a gate insulating film provided on the semiconductor layer, and a gate electrode for controlling a conductivity of the channel region, wherein the semiconductor layer includes a minute protruding portion, a cross-sectional shape of the gate electrode includes a first step portion and a second step portion provided on the first step portion, and a side surface inclination angle of each of the first and second step portions is larger than an inclination angle of the protruding portion of the semiconductor layer.

In a preferred embodiment, the gate electrode preferably includes a first conductive film provided on the gate insulating film and a second conductive film provided on the first conductive film, a width (gate length) of the first conductive film is larger than that of the second conductive film, and the first and second conductive films form the first and second step portions, respectively.

In a preferred embodiment, a surface of the semiconductor layer includes a plurality of mountain-shaped minute protruding portions, and a side surface inclination angle of the gate electrode is larger than an inclination angle of any of the plurality of protruding portions of the semiconductor layer.

In a preferred embodiment, a surface of the semiconductor layer includes a plurality of mountain-shaped minute protruding portions, a side surface inclination of each of the first and second step portions of the gate electrode is larger than an inclination angle of any of the plurality of protruding portions of the semiconductor layer.

In a preferred embodiment, a side surface inclination angle of the gate electrode is preferably about 75° to about 90°.

In a preferred embodiment, an inclination angle of the protruding portion of the semiconductor layer is preferably about 30° to about 70°.

In a preferred embodiment, an average height of the protruding portion is preferably about 8 nm to about 60 nm.

In a preferred embodiment, an average surface roughness (Ra) of a surface of the semiconductor layer is preferably about 4 nm to about 30 nm.

In a preferred embodiment, the semiconductor layer is preferably formed from a crystalline semiconductor film, and the protruding portion is present over a boundary between crystal grains included in the semiconductor layer.

In a preferred embodiment, the crystal grain boundary is a multipoint where three or more crystal grains meet.

In a preferred embodiment, grain diameters of the crystal grains included in the semiconductor layer are preferably about 100 nm to about 1000 nm.

In a preferred embodiment, the crystal grain boundary is visualized through an etching process by a Secco etching method.

In a preferred embodiment, the semiconductor layer is a crystalline semiconductor layer formed through a melting/solidification process, and the protruding portion is formed through the melting/solidification process.

In a preferred embodiment, at least a portion of the semiconductor layer includes a catalyst element capable of promoting crystallization of an amorphous semiconductor film.

In a preferred embodiment, the catalyst element is preferably one or more element selected from the group consisting of nickel (Ni), iron (Fe), cobalt (Co), tin (Sn), lead (Pb), ruthenium (Ru), rhodium (Rh), palladium (Pd), osmium (Os), iridium (Ir), platinum (Pt), copper (Cu) and gold (Au).

In a preferred embodiment, the semiconductor layer is a crystalline semiconductor film made up primarily of regions that are oriented along <111> crystal zone planes.

In a preferred embodiment, approximately 50% or more of the regions that are oriented along the <111> crystal zone planes are regions that are oriented along a (110) plane or a (211) plane.

In a preferred embodiment, domain diameters of crystal domains (regions each having a substantially uniform orientation) of the semiconductor layer are preferably about 2 μm to about 10 μm.

In a preferred embodiment, a lightly-doped impurity region is provided at a junction between the channel region and the source or drain region of the semiconductor layer.

In a preferred embodiment, the first step portion of the gate electrode is present in a lightly-doped impurity region.

In a preferred embodiment, the gate electrode is located above the channel region, and only the first conductive film of the gate electrode is present in a lightly-doped impurity region.

An inventive method for manufacturing a semiconductor device includes the steps of: (a) providing a semiconductor film; (b) melting and solidifying the semiconductor film so as to obtain a crystalline semiconductor layer including a protruding portion on a surface thereof; (c) forming a gate insulating film on the crystalline semiconductor layer; (d) depositing a conductive film on the gate insulating film; and (e) patterning the conductive film to form a gate electrode for controlling a conductivity of the channel region, wherein a side surface inclination angle of the gate electrode is larger than an inclination angle of the protruding portion on the surface of the crystalline semiconductor layer.

In a preferred embodiment, the semiconductor film is an amorphous semiconductor film.

In a preferred embodiment, the step (a) is a step of performing a first heat treatment on an amorphous semiconductor film with a catalyst element capable of promoting crystallization thereof being added to at least a portion thereof so as to crystallize at least a portion of the amorphous semiconductor film, thereby providing a semiconductor film including a crystalline region, and the step (b) is a step of melting and solidifying a semiconductor film including the crystalline region so as to obtain a semiconductor film that includes a crystalline region including a protruding portion on a surface thereof.

In a preferred embodiment, the step (d) preferably includes the steps of: (d-1) depositing a first conductive film on the gate insulating film; and (d-2) depositing a second conductive film on the first conductive film.

In a preferred embodiment, the step (e) preferably includes: a first step (e-1) of etching the second conductive film so that the second conductive film has a first side surface inclination angle; a second step (e-2) of etching the first conductive film so that the first conductive film has a second side surface inclination angle; and a third step (e-3) of further selectively etching the second conductive film, which has been etched so that the second conductive film has the first side surface inclination angle, so that the second conductive film has a third side surface inclination angle that is larger than the first side surface inclination angle, wherein the second side surface inclination angle and the third side surface inclination angle are each larger than the inclination angle of the protruding portion on the surface of the crystalline semiconductor layer.

In a preferred embodiment, the step (e-1), the step (e-2) and the step (e-3) of the step (e) are performed continuously in an etching apparatus.

In a preferred embodiment, the step (e) preferably includes, between the step (e-2) and the step (e-3), a step of doping a portion of the crystalline semiconductor layer with an impurity element giving n-type or p-type conductivity using the etched second conductive film and the etched first conductive film as a mask.

In a preferred embodiment, the method further includes, after the step (e), a step (f) of doping a portion of the island-shaped semiconductor layer with an impurity element giving n-type or p-type conductivity using the gate electrode as a mask.

In a preferred embodiment, the step (f) includes a step (f-1) of performing the doping step through the first conductive film using the second conductive film of the gate electrode as a mask.

In a preferred embodiment, the step (f) preferably includes the steps of: (f-1a) doping a low concentration of the impurity element giving n-type or p-type conductivity through the first conductive film using the second conductive film of the gate electrode as a mask; and (f-2) doping a high concentration of the impurity element giving n-type or p-type conductivity using the first conductive film of the gate electrode as a mask.

In a preferred embodiment, the step (f-1a) and the step (f-2) are performed simultaneously, and the low concentration in the step (f-1a) and the high concentration in the step (f-2) are controlled by a total thickness of the first conductive film and the second conductive film and a thickness of the first conductive film, respectively.

In a preferred embodiment, the method further includes, after the step (f), a step of etching away exposed regions of the first conductive film using the second conductive film of the gate electrode as a mask.

In a preferred embodiment, the step (e) is preferably performed by an ICP etching method.

In a preferred embodiment, the step (e) is preferably performed by an RIE method.

In a preferred embodiment, the step (b) preferably includes a step of irradiating the semiconductor film with laser light.

In a preferred embodiment, the laser light irradiation step is performed so that any point on the semiconductor film is irradiated with pulsed laser light a plurality of times continuously.

In a preferred embodiment, the catalyst element is one or more element selected from the group consisting of nickel (Ni), iron (Fe), cobalt (Co), tin (Sn), lead (Pb), ruthenium (Ru), rhodium (Rh), palladium (Pd), osmium (Os), iridium (Ir), platinum (Pt), copper (Cu) and gold (Au).

An inventive electronic device includes any of the semiconductor devices described above.

In a preferred embodiment, the electronic device further includes a display section where an image is displayed by using the semiconductor device according to preferred embodiments of the present invention.

Other features, elements, characteristics, steps and advantages of the present invention will become more apparent from the following detailed description of preferred embodiments with reference to the attached drawings.

BRIEF DESCRIPTION OF THE DRAWINGS

FIG. 2A to FIG. 2F are schematic cross-sectional views illustrating steps for manufacturing a semiconductor device according to a second preferred embodiment of the present invention.

FIG. 11A and FIG. 11B are schematic cross-sectional views each illustrating a portion near the source-drain junction of a top-gate TFT including a semiconductor layer having protruding portions on the surface thereof, wherein FIG. 11A illustrates a conventional TFT, and FIG. 11B illustrates a TFT of a preferred embodiment of the present invention.

FIG. 14A to FIG. 14C are diagrams illustrating the crystal orientation a crystalline semiconductor film obtained by crystallizing an amorphous semiconductor film while adding a catalyst element thereto, wherein FIG. 14A illustrates how the crystal growth proceeds, FIG. 14B illustrates the <111> crystal zone planes, and FIG. 14C illustrates a standard triangle of crystal orientation.

DETAILED DESCRIPTION OF PREFERRED EMBODIMENTS

Figure 10A:
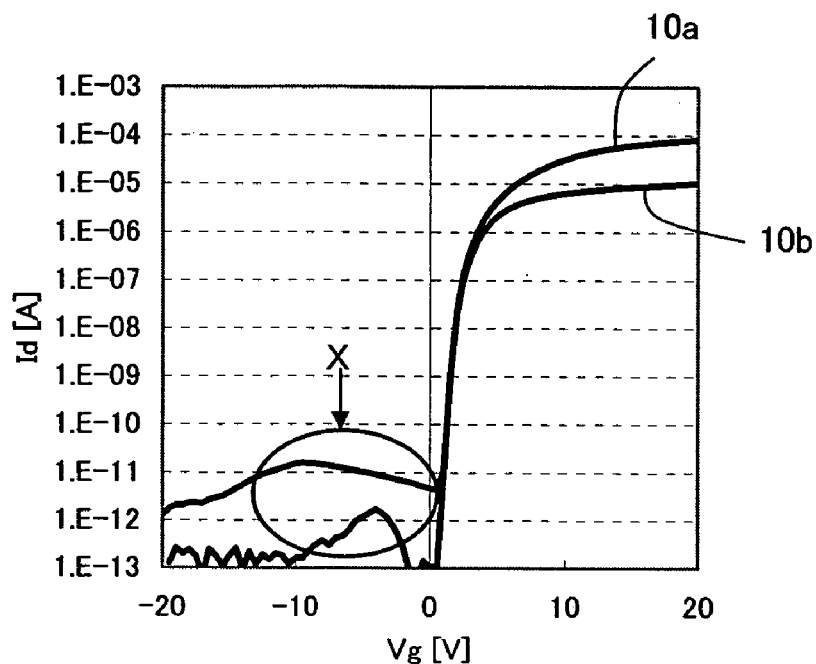
FIG. 10A is a graph illustrating the Vg-Id characteristics of a TFT having an abnormal leak current.
Figure 10B:
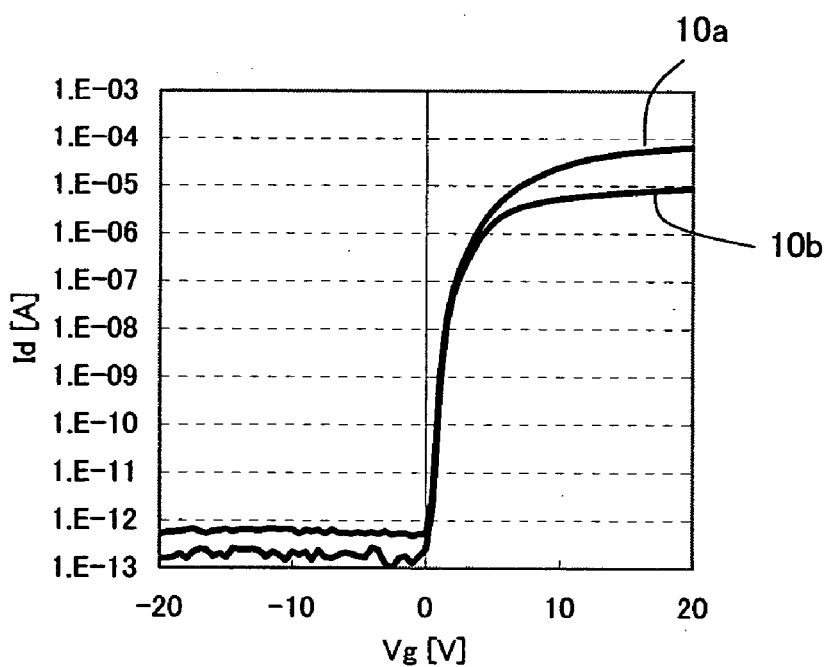
FIG. 10B is a graph illustrating the Vg-Id characteristics of a normal TFT.

The present inventors conducted an in-depth study regarding the mechanism and cause for the humped curve of leak current occurring while the TFT is off as illustrated in FIG. 10A. As a result, the present inventors discovered that the leak current was caused by ridges on the surface of the semiconductor layer, and based on this discovery, the present inventors developed the preferred embodiments of the present invention. It has been reported in the art that surface irregularities/ridges of a semiconductor layer deteriorate the on-state characteristics, the voltage endurance of the gate insulating film, and the device reliability, as described above. However, it has not been reported that the surface irregularities/ridges of a semiconductor layer have an influence on the off-state leak current.

The process of identifying the cause for the humped curve of leak current, the results thereof, and preferred embodiments of the present invention, will now be described.

Figure 11A:
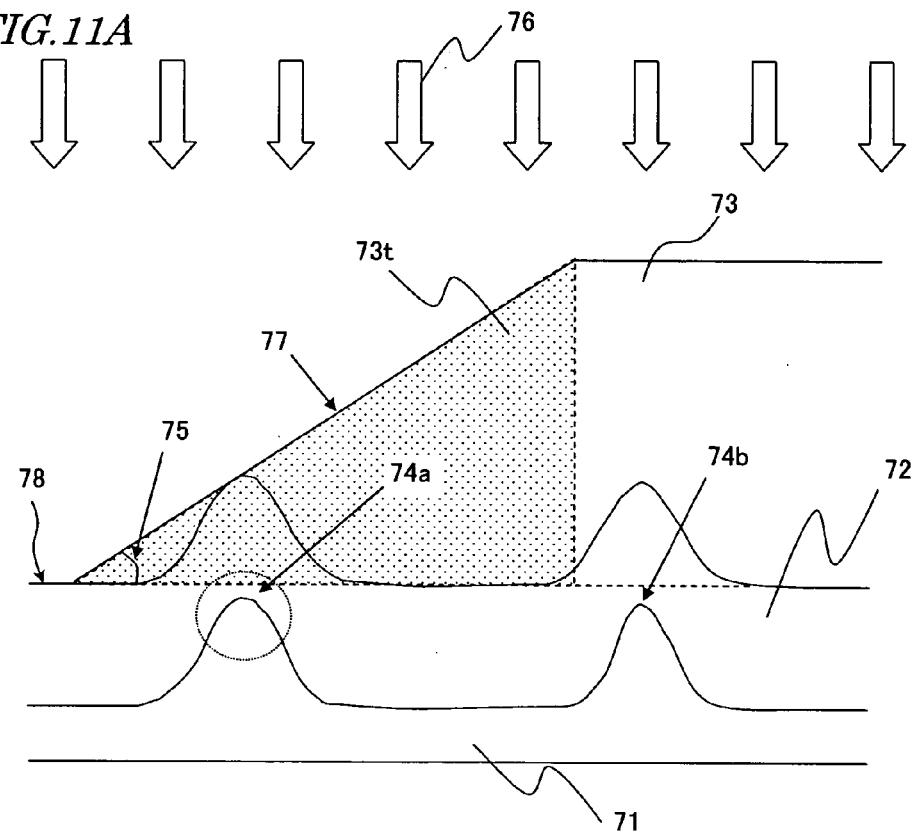

FIG. 11A is schematic cross-sectional views each illustrating a portion near the source-drain junction of a top-gate TFT including a semiconductor layer having protruding portions on the surface thereof. Referring to FIG. 11A, a gate insulating film 72 is provided on a semiconductor layer 71, and a gate electrode 73 is provided on the gate insulating film 72. The semiconductor layer 71 includes, on the surface thereof, ridges 74a and 74b formed through the melting/solidification process by laser irradiation. The gate insulating film 72 is deposited so as to cover the semiconductor layer 71 having the ridges 74 with a substantially uniform thickness across the gate insulating film 72 including portions over the ridges 74. Therefore, the surface irregularities are transferred to the surface of the gate insulating film 72. Since the gate insulating film 72 is not thinned over the ridges 74, the presence of the ridges 74 does not substantially deteriorate the voltage endurance of the gate insulating film 72. The gate electrode 73 is formed on the gate insulating film 72. The gate electrode 73 has an inclined side surface 77. It is believed that it is desirable to have a small angle 75 (hereinafter referred to as "side surface inclination angle") between the side surface 77 and a bottom surface 78 of the gate electrode 73. If the side surface inclination angle 75 of the gate electrode 73 is small, it is possible to prevent a line to be formed on the gate electrode 73 from breaking at the step portion of the gate electrode 73. In addition, if the angle 75 is small, the coverage (step-covering property) of an overlying insulating film is improved, thereby preventing a leak current through the step portion. For these reasons above, it is believed in the art that the side surface inclination angle of the gate electrode 73 is preferably small.

Then, an impurity element 76 giving n-type conductivity is implanted into the structure for obtaining an n-channel TFT (an impurity element giving p-type conductivity is implanted for obtaining a p-channel TFT) in a self-aligned manner using the gate electrode 73 as a mask. For a TFT for which suppressing the off-state current is of particular importance, such as a pixel TFT, the impurity may be implanted at a low concentration. At this point, the ridgemimicking property of the gate electrode 73 has been lowered by an etching process in a tapered portion 73t of the gate electrode 73. The "tapered portion 73t" of the gate electrode 73 is a portion of the gate electrode 73 between the side surface 77, which has been inclined by etching, and the bottom surface 78. If the ridge 74a having a larger size (e.g., a ridge having a height of about 40 nm or more) happens to be present under the tapered portion 73t, as illustrated in FIG. 11A, the thickness of the gate electrode 73 is reduced in the tapered portion 73t. In some cases, a portion of the gate electrode 73 may disappear with the gate insulating film 72 being exposed therethrough, as confirmed by SEM.

Figure 12A:
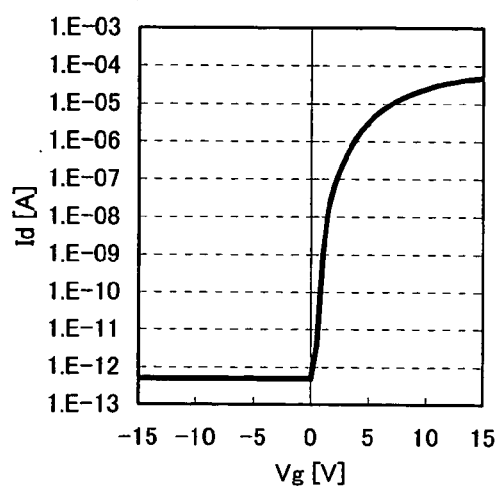
FIG. 12A is a graph illustrating the Vg-Id characteristics of an n-doped ridge of a TFT.
Figure 12B:
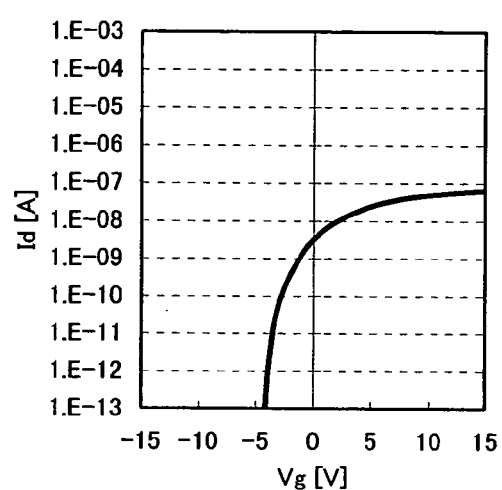
FIG. 12B is a graph illustrating the Vg-Id characteristics of a normal portion of the TFT.
Figure 12C:
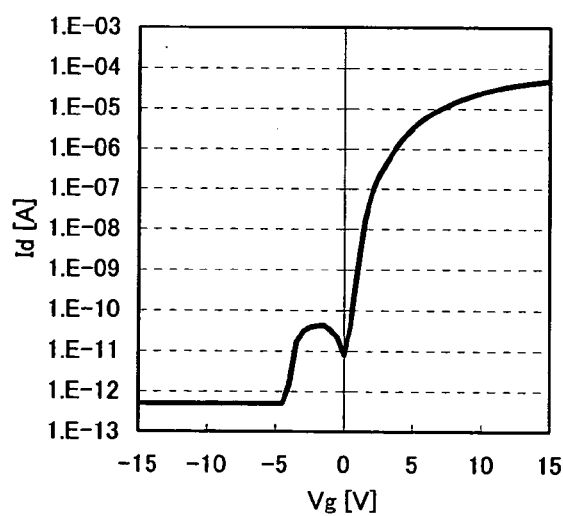
FIG. 12C is a graph illustrating the overall Vg-Id characteristics of the TFT.

When an impurity element giving n-type conductivity, for example, is implanted into such a structure, a small amount of the n-type impurity is implanted into the ridge 74a under the tapered portion 73t, which is supposed to be masked with the gate electrode 73 and left undoped. As a result, only the ridge 74a is n-doped in the channel-forming region under the gate electrode 73 in the semiconductor layer 71. If a portion of the channel-forming region is n-doped, the portion functions as a parasitic transistor. Thus, the ridge functions as an n-doped parasitic transistor, thereby exhibiting Vg-Id characteristics as shown in FIG. 12B. In contrast, a normal portion exhibits Vg-Id characteristics as shown in FIG. 12A. Since the area of the ridge 74a is very small as compared to the area of the entire channel region of the TFT, the current Id through the parasitic transistor is smaller than that through the entire channel region according to the area ratio therebetween, as illustrated in FIG. 12B. Moreover, the parasitic transistor portion exhibits a characteristics curve that is shifted in the negative direction from that of a normal TFT, because the parasitic transistor portion is n-doped. The amount of the shift depends on the concentration of the n-type impurity implanted into the ridge (parasitic transistor portion), and the shift in the negative direction is greater as the concentration is higher. The overall Vg-Id characteristics of the TFT is the combination of these two curves, as illustrated in FIG. 12C. Thus, in a portion of the off-state region where the absolute value of the gate voltage is small, only the parasitic transistor in the ridge 74a is turned on, thereby resulting in a humped curve of leak current, as illustrated in FIG. 12C.

This is the mechanism of the occurrence of the humped curve of leak current discovered by the present inventors. While the mechanism has been described referring to FIG. 11A and FIG. 12A to FIG. 12C assuming that the TFT is an n-channel TFT, a similar phenomenon occurs also with a p-channel TFT. With a p-channel TFT, an impurity element giving p-type conductivity is implanted into the ridge 74a, which behaves as a parasitic transistor whose current Id curve is shifted in the positive direction, whereby only the parasitic transistor portion is turned on in a portion of the off-state region (where the gate voltage is of a positive value), thus resulting in a humped curve of leak current.

In developing the preferred embodiments of the present invention, the present inventors set out to solve the problems described above in a simple manner without complicating the manufacturing process or the manufacturing apparatus and without increasing the manufacturing cost. Preferred embodiments of the semiconductor device and the method for manufacturing the same according to the present invention will now be described in detail.

A semiconductor device of a preferred embodiment of the present invention preferably includes a thin film transistor including a semiconductor layer that includes a channel region, a source region and a drain region and includes a protruding portion on the surface thereof, a gate insulating film provided on the semiconductor layer, and a gate electrode for controlling the conductivity of the channel region. The semiconductor device is characterized in that the side surface inclination angle of the gate electrode is larger than the inclination angle of the protruding portion on the surface of the semiconductor layer. Typically, there are a plurality of mountain-shaped protruding portions on the surface of the semiconductor layer, and the side surface inclination angle of the gate electrode is larger than the inclination angle of any of the individual mountain-shaped protruding portions of the semiconductor layer.

Figure 11B:
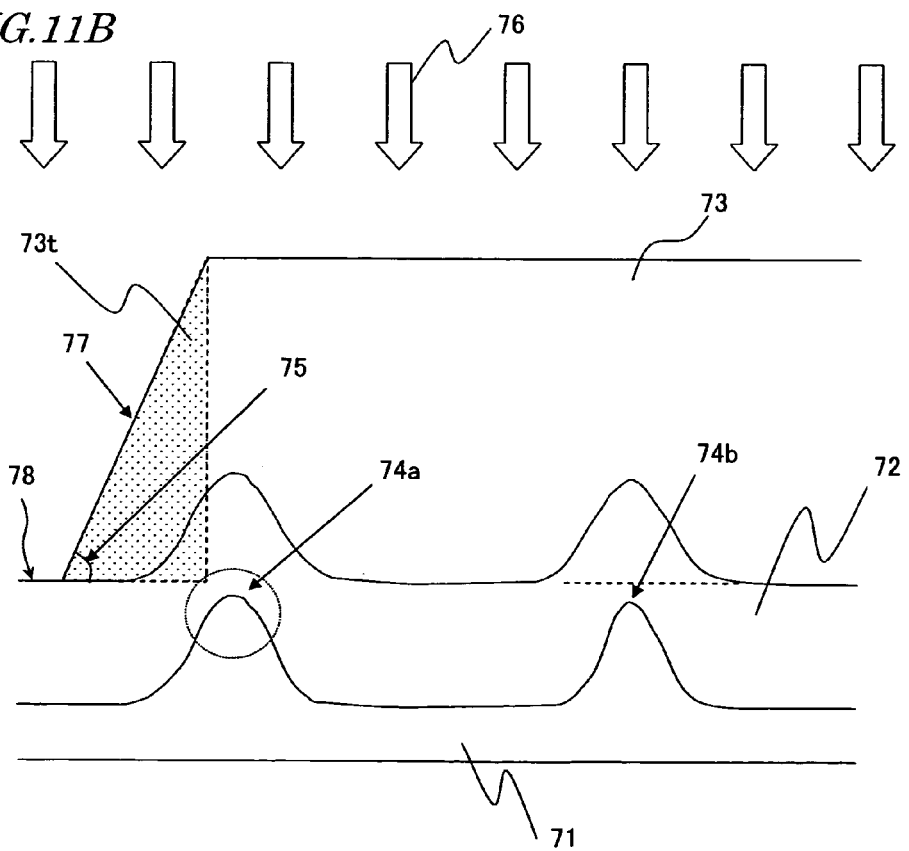
Figure 13A:
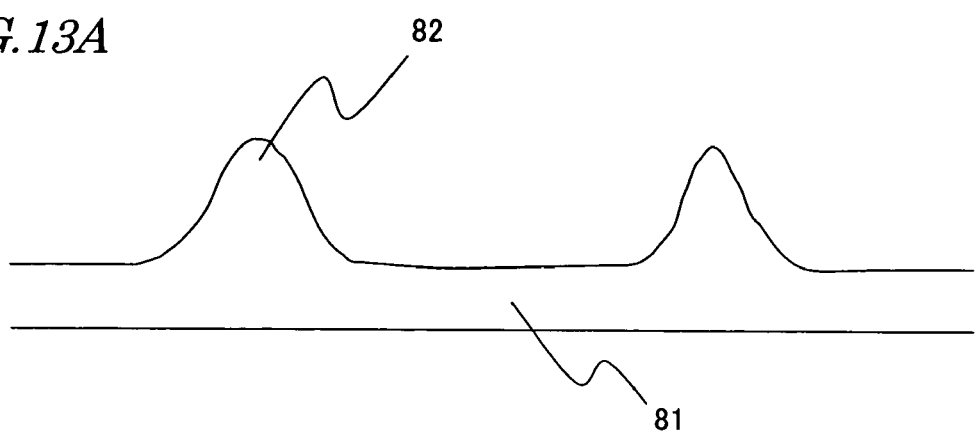
FIG. 13A and FIG. 13B are schematic cross-sectional views illustrating the inclination angle of a protruding portion on the surface of a semiconductor layer.
Figure 13B:
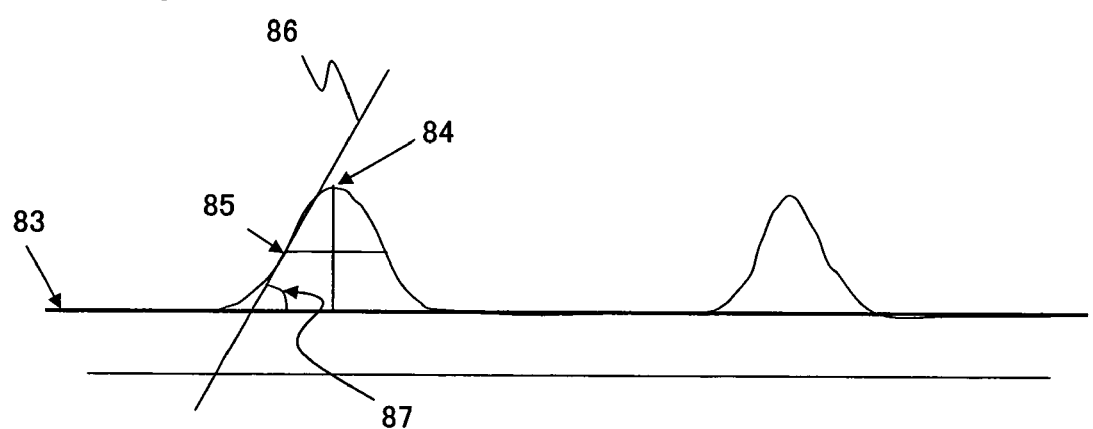

Thus, the side surface inclination angle 75 of the gate electrode in the semiconductor device of at least one preferred embodiment of the present invention is larger than the inclination angle of the protruding portion 74a on the surface of the semiconductor layer, as illustrated in FIG. 11B. In preferred embodiments of the present invention, the inclination angle of the protruding portion on the surface of the semiconductor layer is defined as the angle between a baseline and a tangential line along a cross section of the semiconductor layer (taken in the channel direction), where the baseline extends along the surface of the semiconductor layer, and the tangential line is a line tangential to the protruding portion at a position half the height of the protruding portion. Referring to FIG. 13A and FIG. 13B, the inclination angle of a ridge (protruding portion) 82 on the surface of a semiconductor layer 81 will be described in greater detail. As illustrated in FIG. 13B, a baseline 83 is drawn along a flat portion (non-protruding portion) of the surface of the semiconductor layer 81. A tangential line 86 is drawn to be tangential to the protruding portion 82 at a position 85 half the height of the protruding portion 82 (half the height between the baseline 83 and a tip 84 of the protruding portion 82). The inclination angle of the ridge (protruding portion) 82 of the semiconductor layer 81 is defined as an angle 87 between the tangential line 86 and the baseline 83.

With such a structure, even if there are irregularities on the surface of the semiconductor layer, it is possible to prevent the formation of a parasitic transistor as described above under the tapered portion of the gate electrode, and to prevent a defect represented by a humped curve of off-state leak current.

In a preferred embodiment of the present invention, a semiconductor device preferably includes a thin film transistor including a semiconductor layer that includes a channel region, a source region and a drain region and includes a protruding portion on the surface thereof, a gate insulating film provided on the semiconductor layer, and a gate electrode for controlling the conductivity of the channel-forming region, wherein the cross-sectional shape of the gate electrode includes step portions, and the side surface inclination angle of each of the step portions is larger than the inclination angle of the protruding portion on the surface of the semiconductor layer. Typically, there are a plurality of mountain-shaped protruding portions on the surface of the semiconductor layer, and the side surface inclination angle of each of the step portions (e.g., the lowermost step portion) of the gate electrode having a stepped cross-sectional shape is larger than the inclination angle of any of the individual mountain-shaped protruding portions on the surface of the semiconductor layer.

The gate electrode may have a layered structure including at least two layers of different conductive films. In such a case, the width (gate length) of the lower conductive film is larger than that of the upper conductive film, and the side surface inclination angle of each of the lower and upper conductive films is larger than the inclination angle of the protruding portion on the surface of the semiconductor layer. Typically, the surface of the semiconductor layer includes a plurality of mountain-shaped protruding portions, and the side surface inclination angle of each of lower and upper conductive films of the gate electrode having a layered structure including at least two layers of different conductive films is larger than the inclination angle of any of the individual mountain-shaped protruding portions of the semiconductor layer.

With such a structure, even with a TFT whose gate electrode has a stepped or layered structure and even though there are protruding portions on the surface of the semiconductor layer, it is possible to prevent the formation of a parasitic transistor as described above under the tapered portion of the gate electrode, and to prevent a defect represented by a humped curve of off-state leak current.

It is preferred that the side surface inclination angle of the gate electrode is about 75° to about 90°. When the side surface inclination angle is about 75° or more, it is possible to more reliably prevent a defect due to a leak current. When the side surface inclination angle is about 90° or less, the entire side surface of the gate electrode is sufficiently covered with the overlying insulating film, and thus it is unlikely that a portion of the side surface of the gate electrode will be shaded by the gate electrode and left uncovered. Thus, it is possible to suppress a leak current through such an uncovered portion of the side surface of the gate electrode.

It is preferred that a lightly-doped impurity region (LDD region) is provided at the junction between the channel region and the source or drain region of the semiconductor layer. In a case where the gate electrode has a stepped cross-sectional shape, it is preferred that one or more lower step portions (e.g., the lowermost step portion) are provided in the lightly-doped impurity region (LDD region) of the semiconductor layer. Alternatively, it is preferred that the region of the semiconductor layer over which lower and upper conductive films of the gate electrode having a layered structure including two layers of different conductive films are present is the channel region, and the region over which only the lower conductive film is present is the lightly-doped impurity region (LDD region).

When the gate electrode has a stepped or layered structure as described above, an LDD region can be formed in a self-aligned manner in the junction between the channel region and the source or drain region. An LDD region is provided for decreasing the off-state current of a TFT and increasing the hot carrier resistance so as to improve the reliability. However, if the length of this region varies, the device reliability varies, and moreover it creates a parasitic resistance, thereby also varying the on-state characteristics. When the gate electrode has a stepped or layered structure as described above and the lower portion thereof where one or more lower step portions or the lower conductive film are present is used as the LDD region, it is possible to stably obtain constant LDD regions.

A protruding portion on the surface of a semiconductor layer is normally present over a crystal grain boundary in the semiconductor layer. Typically, a protruding portion of the semiconductor layer is present over a multipoint where three or more crystal grains meet. Such a protruding portion is formed in the process of melting/solidifying an amorphous semiconductor film to obtain a crystalline semiconductor film. In the melting/solidification process, the crystal grain boundary portions, which are solidified lastly, are raised in a linear pattern to form a protruding portion due to difference in volumetric expansion coefficient between a melted portion and a solidified portion of the semiconductor film. The term "crystal grain boundary" as used herein refers to one that is visualized through an etching process by a Secco etching method. A Secco etching method is a method of selectively etching a portion of a poor crystallinity such as a crystal grain boundary portion by using a mixed solution of potassium dichromate and hydrofluoric acid.

In the present preferred embodiment, the semiconductor device is manufactured by a method including the steps of: providing an amorphous semiconductor film; melting and solidifying the amorphous semiconductor film so as to obtain a semiconductor film including a crystalline region having a protruding portion on the surface thereof; patterning the semiconductor film so as to form an island-shaped semiconductor layer including a crystalline region having a protruding portion on the surface thereof; forming a gate insulating film on the island-shaped semiconductor layer; depositing a conductive film on the gate insulating film; patterning/etching the conductive film so as to form a gate electrode for controlling the conductivity of the channel-forming region, wherein the side surface inclination angle of the gate electrode is larger than the inclination angle of the protruding portion on the surface of the island-shaped semiconductor layer; and doping a portion of the island-shaped semiconductor layer with an impurity element giving n-type or p-type conductivity using the gate electrode as a mask. With such a manufacturing method, even if there are irregularities on the surface of the semiconductor layer, it is possible to prevent a ridge (protruding portion) of the semiconductor layer from being doped with an impurity under the tapered portion of the gate electrode, thereby preventing the formation of a parasitic transistor as described above. As a result, it is possible to obtain a semiconductor device as described above, in which a defect represented by a humped curve of off-state leak current is prevented.

In a preferred embodiment, the semiconductor device is manufactured by a method including the steps of: providing an amorphous semiconductor film with a catalyst element capable of promoting crystallization thereof being added to at least a portion thereof; performing a first heat treatment on the amorphous semiconductor film so as to crystallize at least a portion of the amorphous semiconductor film, thereby obtaining a semiconductor film including a crystalline region; melting/solidifying the semiconductor film including a crystalline region so as to obtain a semiconductor film including a crystalline region having a protruding portion on the surface thereof; patterning the semiconductor film so as to form an island-shaped semiconductor layer including a crystalline region having a protruding portion on the surface thereof; forming a gate insulating film on the island-shaped semiconductor layer; depositing a conductive film on the gate. insulating film; patterning/etching the conductive film so as. to form a gate electrode for controlling the conductivity of the channel region, wherein the side surface inclination angle of the gate. electrode is larger than the inclination angle of the protruding portion on the surface of the island-shaped semiconductor layer; and doping a portion of the island-shaped semiconductor layer with an impurity element giving n-type or p-type conductivity using the gate electrode as a mask. With such a manufacturing method, it is possible to prevent a ridge (protruding portion) of the semiconductor layer from being doped with an impurity under the tapered portion of the gate electrode, thereby preventing the formation of a parasitic transistor, thus achieving the advantages of the present invention.

In addition, with this manufacturing method, it is possible to obtain a desirable crystalline semiconductor film with a uniform orientation by melting/solidifying a crystalline semiconductor film, which is obtained by crystallizing an amorphous semiconductor film through a heat treatment using a catalyst element capable of promoting crystallization thereof. With such a method, as compared with the other method of crystallizing an amorphous semiconductor film by directly melting/solidifying the amorphous semiconductor film, it is possible to obtain a current driving power that is twice as high or more in terms of the field-effect mobility of a thin film transistor. With this method, however, the metal element used as the catalyst element may have an adverse influence on the semiconductor. Therefore, when such a manufacturing method is used, the catalyst element is removed from the channel region and from the junction between the channel region and the source/drain region. The present inventors refer to this process as "gettering". The catalyst element, by nature, is attracted to a region where a group VB element giving n-type conductivity (e.g., phosphorus) or a group IIIB element giving p-type conductivity (e.g., boron) is present. Thus, such elements are introduced to form a "gettering region" to attract the catalyst element thereto.

However, if the semiconductor layer has surface irregularities, and a ridge under the tapered portion of the gate electrode is partially doped with an impurity element giving n-type or p-type conductivity, the catalyst element is attracted not to the gettering region but to the ridge. Thus, in addition to the formation of a parasitic transistor described above, the catalyst element is trapped and segregated in such a portion, thereby increasing the TFT off-state leak current. The area under the tapered portion of the gate electrode corresponds to the junction between the channel-forming region and the source/drain region, where the electric field localization is most prominent. If the catalyst element segregation occurs in this area, the area becomes a leak path, thereby increasing the leak current. The present invention prevents the ridge of the semiconductor layer in the tapered portion of the gate electrode from being doped with an impurity element, whereby it is possible to reduce the segregation of a catalyst element in the ridge, which has been causing problems in conventional methods in which a catalyst element is used. Thus, where crystallization is performed with a catalyst element, the present preferred embodiment provides another advantageous effect in addition to the effect of preventing the formation of a parasitic transistor.

In another preferred embodiment, the semiconductor device is manufactured by a method including the steps of: providing an amorphous semiconductor film; melting and solidifying the amorphous semiconductor film so as to obtain a semiconductor film including a crystalline region having a protruding portion on the surface thereof; patterning the semiconductor film so as to form an island-shaped semiconductor layer including a crystalline region having a protruding portion on the surface thereof; forming a gate insulating film on the island-shaped semiconductor layer; depositing a first conductive film on the gate insulating film; depositing a second conductive film on the first conductive film; patterning/etching the first conductive film and the second conductive film so as to form a gate electrode having a stepped and layered structure, with the width of the second conductive film being smaller than that of the first conductive film, wherein the side surface inclination angle of each of the first conductive film and the second conductive film of the gate electrode is larger than the inclination angle of the protruding portion on the surface of the island-shaped semiconductor layer; and doping a portion of the island-shaped semiconductor layer with an impurity element giving n-type or p-type conductivity using the gate electrode as a mask.

In this method, the step of obtaining a semiconductor film including a crystalline region having a protruding portion on the surface thereof may include the steps of: providing an amorphous semiconductor film with a catalyst element capable of promoting crystallization thereof being added to at least a portion thereof; performing a first heat treatment on the amorphous semiconductor film so as to crystallize at least a portion of the amorphous semiconductor film, thereby obtaining a semiconductor film including a crystalline region; and melting/solidifying the semiconductor film including a crystalline region so as to obtain a semiconductor film including a crystalline region having a protruding portion on the surface thereof.

With such a method, it is possible to prevent a ridge (protruding portion) of the semiconductor layer from being doped with an impurity and prevent the formation of a parasitic transistor under the tapered portion of the gate electrode, thus achieving the advantages of the present invention. Moreover, where crystallization is performed with a catalyst element, this method provides an additional effect of reducing the segregation of the catalyst element in the ridge. In addition to these effects, when the gate electrode has a layered and stepped structure including the first conductive film and the second conductive film, an LDD region (lightly-doped impurity region) can be formed in the doping process in a self-aligned manner with respect to the gate electrode. As a result, it is possible to reduce the size of the semiconductor element, thereby increasing the degree of integration, in addition to improving the device reliability and reducing the off-state current.

In this method, the step of patterning/etching the first conductive film and the second conductive film so as to form a gate electrode having a stepped and layered structure, with the width of the second conductive film being smaller than that of the first conductive film, wherein the side surface inclination angle of each of the first conductive film and the second conductive film of the gate electrode is larger than the inclination angle of the protruding portion on the surface of the island-shaped semiconductor layer, may include the steps of: etching the second conductive film so that the second conductive film has a first side surface inclination angle; etching the first conductive film so that the first conductive film has a second side surface inclination angle; and selectively etching the second conductive film, which has been etched so that the second conductive film has the first side surface inclination angle, so that the second conductive film has a third side surface inclination angle that is larger than the first side surface inclination angle, whereby the second side surface inclination angle and the third side surface inclination angle are both larger than the inclination angle of the protruding portion on the surface of the island-shaped semiconductor layer. In this way, the gate electrode having a stepped and layered structure in which the width of the first conductive film is smaller than that of the second conductive film can be formed easily and with excellent controllability.

It is preferred that the step of etching the second conductive film so that the second conductive film has a first side surface inclination angle, the step of etching the first conductive film so that the first conductive film has a second side surface inclination angle, and the step of selectively etching the second conductive film, which has been etched so that the second conductive film has the first side surface inclination angle, so that the second conductive film has a third side surface inclination angle that is larger than the first side surface inclination angle, are performed continuously in an etching apparatus. In this way, it is possible to easily obtain a gate electrode having a shape as described above without increasing the number of process steps, thus reducing the manufacturing cost.

Moreover, the manufacturing method may include, after the step of etching the second conductive film so that the second conductive film has a first side surface inclination angle and the step of etching the first conductive film so that the first conductive film has a second side surface inclination angle, the step of doping a portion of the island-shaped semiconductor layer with an impurity element giving n-type or p-type conductivity using, as a mask, the second conductive film, which has been etched so that the second conductive film has the first side surface inclination angle, and the first conductive film, which has been etched so that the first conductive film has the second side surface inclination angle. In such a case, in the obtained stepped gate electrode, the doping process is performed completely selectively with respect to the final width of the first conductive film, whereby the semiconductor layer is prevented from being doped with an unintended impurity (or with an impurity at an unintended concentration) through the first conductive film.

In this manufacturing method, in the step of doping a portion of the island-shaped semiconductor layer with an impurity element giving n-type or p-type conductivity using the gate electrode as a mask, the semiconductor layer may be doped through the first conductive film using the second conductive film as a mask. Alternatively, in the step of doping a portion of the island-shaped semiconductor layer with an impurity element giving n-type or p-type conductivity using the gate electrode as a mask, the semiconductor layer may be doped with a low concentration of an impurity element giving n-type or p-type conductivity through the first conductive film using the second conductive film of the gate electrode as a mask, and then doped with a high concentration of an impurity element giving n-type or p-type conductivity using the first conductive film of the gate electrode as a mask. By performing these steps, an LDD region can be formed in a self-aligned manner by utilizing the difference between the width of the first conductive film and that of the second conductive film (i.e., the length of the step portion).

Alternatively, the step of doping the semiconductor layer with a low concentration of an impurity element giving n-type or p-type conductivity through the first conductive film using the second conductive film of the gate electrode as a mask, and the step of doping the semiconductor layer with a high concentration of an impurity element giving n-type or p-type conductivity using the first conductive film of the gate electrode as a mask, may be performed simultaneously by utilizing the difference in ion range in the doping process as controlled by the thicknesses of the first and second conductive films. In such a case, the concentration for the low-concentration doping and the concentration for the high-concentration doping can be controlled by the total of the thicknesses of the first and second conductive films and by the thickness of the first conductive film, respectively.

Alternatively, after the step of doping a portion of the island-shaped semiconductor layer with an impurity element giving n-type or p-type conductivity using the gate electrode as a mask, a portion of the first conductive film may be etched away by using the second conductive film of the gate electrode as a mask. In such a case, a portion of the semiconductor layer under the portion of the first conductive film that is etched away becomes an LDD region over which the gate electrode is absent. With such a structure, the LDD region is particularly effective in reducing the TFT off-state leak current. In contrast, with the first conductive film being left unetched, the LDD region is formed in the region over which only the first conductive film is present, whereby the gate electrode will be present over the LDD region of the TFT. With such a structure, although the effect of reducing the TFT off-state current is decreased, the hot carrier resistance increases, thereby improving the device reliability. Thus, for example, a portion of the first conductive film may be etched away using the second conductive film as a mask for some TFTs, whereby TFTs of different characteristics can be produced according to the purposes of the individual elements.

In the various preferred embodiments described above, the step of patterning (e.g., etching) a conductive film so as to form a gate electrode is preferably performed by an ICP (Inductively Coupled Plasma) etching method or an RIE (Reactive Ion Etching) method. With such methods, it is possible to precisely form, by etching, a gate electrode having a side surface inclination angle as described above. Particularly, the first conductive film and the second conductive film may be formed in a layered structure, and the layered structure may be etched into a stepped shape, as described above, while ensuring a sufficient etching precision.

In the various preferred embodiments described above, the step of melting/solidifying an amorphous semiconductor film or a semiconductor film including a crystalline region so as to obtain a semiconductor film including a crystalline region having a protruding portion on the surface thereof may be performed by irradiating, with laser light, the amorphous semiconductor film or the semiconductor film including a crystalline region. Preferably, the amorphous semiconductor film or the semiconductor film including a crystalline region is irradiated with pulsed laser light so that any point on the amorphous semiconductor film or the semiconductor film including a crystalline region is irradiated with pulsed laser light a plurality of times continuously. In this way, it is possible to obtain a crystalline semiconductor film having a desirable crystallinity without giving a thermal damage to the substrate. In a case where the amorphous semiconductor film is directly irradiated with laser light, the obtained crystalline semiconductor film having surface irregularities preferably has a crystal grain diameter of about 100 nm to about 1000 nm. When the crystal grain diameter is within such a range, TFTs of desirable characteristics are obtained stably. Specifically, in the semiconductor device of the present preferred embodiment, the grain diameter of a crystal grain defined by a crystal grain boundary in the semiconductor layer is preferably about 100 nm to about 1000 nm. The crystal grain boundary as used herein is one that is visualized through an etching process by a Secco etching method described above.

Moreover, in the semiconductor device produced by a manufacturing method as described above, where the semiconductor layer is crystallized using a catalyst element, the catalyst element capable of promoting crystallization of an amorphous semiconductor film is included at least in a portion of the semiconductor layer. Particularly, when the gettering process of moving the catalyst element to a region other than the channel region is performed, the catalyst element is present at a high concentration in the source/drain region or in a dedicated gettering region outside the source/ drain region. The catalyst element may be one or more element selected from the group consisting of nickel (Ni), iron (Fe), cobalt (Co), tin (Sn), lead (Pb), ruthenium (Ru), rhodium (Rh), palladium (Pd), osmium (Os), iridium (Ir), platinum (Pt), copper (Cu) and gold (Au). These elements can provide a crystallization promoting effect even in very small amounts. Particularly, Ni can provide the most significant effect.

When the semiconductor layer is crystallized with a catalyst element, it is preferred that the semiconductor layer is a crystalline semiconductor film in which the orientated crystal planes are primarily planes of <111> crystal zone. Moreover, it is preferred that the semiconductor layer is a crystalline semiconductor film in which the orientated crystal planes are primarily planes of <111> crystal zone, and in which about 50% or more of the regions that are oriented along the <111> crystal zone planes are regions that are oriented along the (110) plane or the (211) plane.

Figure 14A:
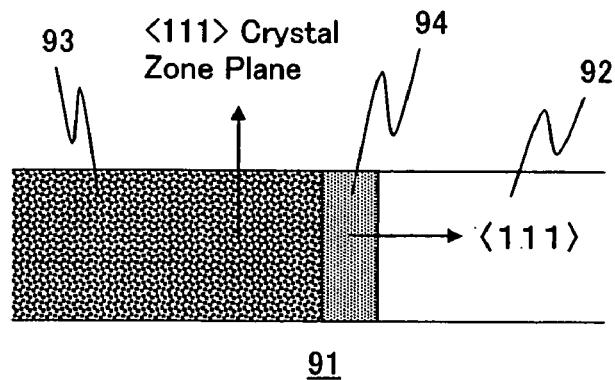

Typically, when crystallized without a catalyst element, a crystalline semiconductor film is likely to be oriented along the (111) plane, due to the influence of the insulator base film underlying the semiconductor film (particularly in the case of amorphous silicon dioxide). In contrast, when an amorphous semiconductor film is crystallized with the addition of a catalyst element, the crystallization proceeds in a distinctive manner as illustrated in FIG. 14A. Referring to FIG. 14A, a base insulator 91 includes a semiconductor compound 94 of the catalyst element, which is the driving force of the crystal growth. As illustrated in FIG. 14A, the catalyst element compound 94 is present at the front line of crystal growth and gradually crystallizes an amorphous semiconductor film 92 in the uncrystallized region from left to right in the figure. In this process, the catalyst element compound 94 tends to grow strongly in the <111> direction. As a result, the obtained crystalline semiconductor film 93 is oriented in the <111> crystal zone planes, as illustrated in FIG. 14A.

Figure 14B:
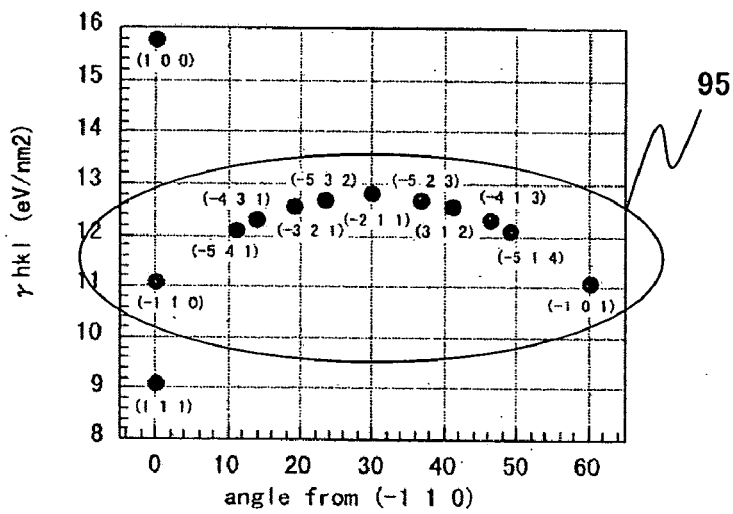
Figure 14C:
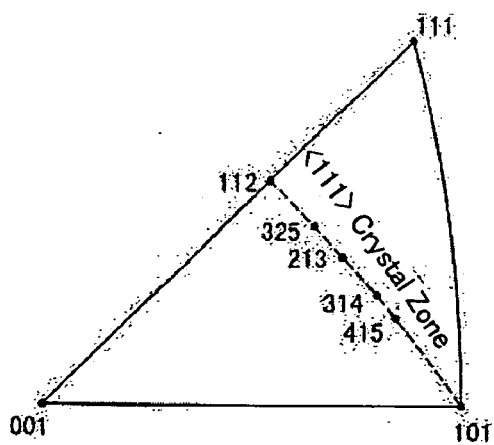

FIG. 14B illustrates the <111> crystal zone planes. In FIG. 14B, the horizontal axis represents the inclination angle with respect to the (–100) plane, and the vertical axis represents the surface energy. Reference numeral 95 denotes a group of crystal planes that are <111> crystal zone planes. The (100) plane and the (111) plane are shown for the purpose of comparison, though they are not <111> crystal zone planes. Moreover, FIG. 14C illustrates a standard triangle of crystal orientation. The distribution of the <111> crystal zone planes is as indicated by a broken line. The indices of typical poles are shown numerically. Among all the <111> crystal zone planes, the (110) plane or the (211) plane is dominant in the crystalline semiconductor film obtained in the present preferred embodiment, and advantageous effects are obtained when these planes account for about 50% or more. These two crystal planes, having much higher hole mobilities than other planes, are capable of improving the performance of particularly a p-channel TFT, which is inferior in performance to an n-channel TFT, thereby also providing an advantage that it is easy to produce a well-balanced semiconductor circuit.

Figure 15A:
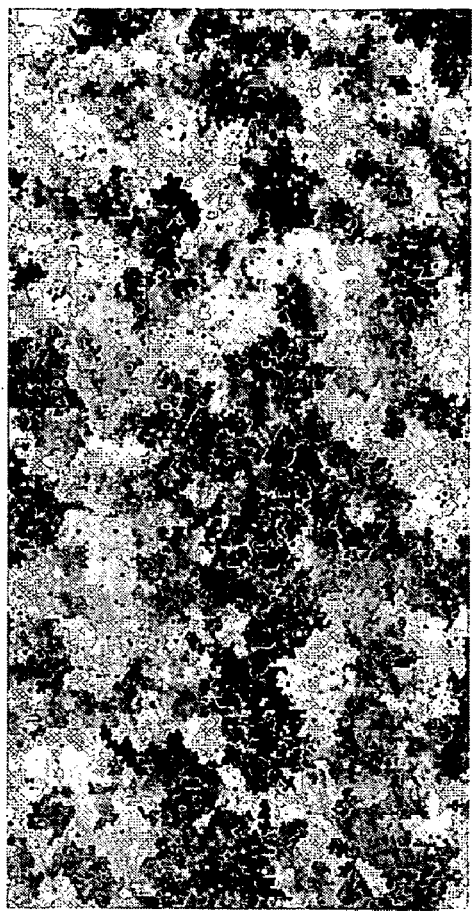
FIG. 15A and FIG. 15B each illustrate the orientation distribution of a crystalline semiconductor film obtained by using a catalyst element.
Figure 15B:
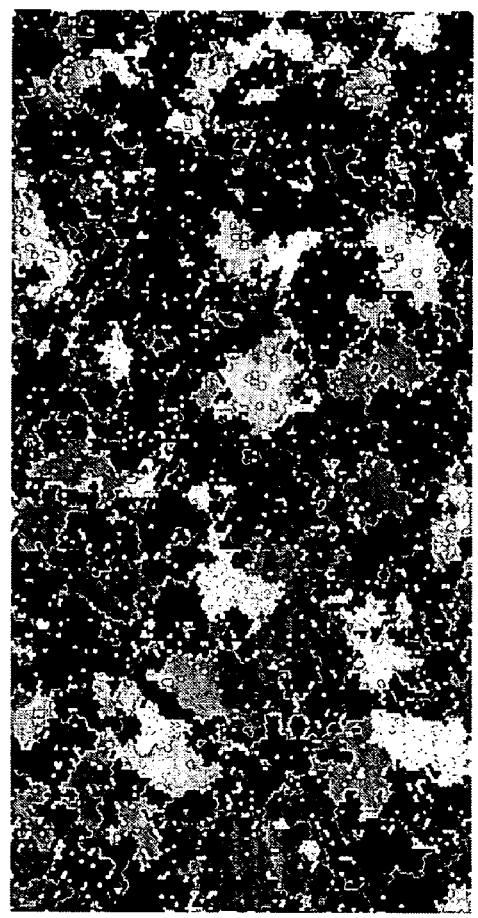
Figure 15C:
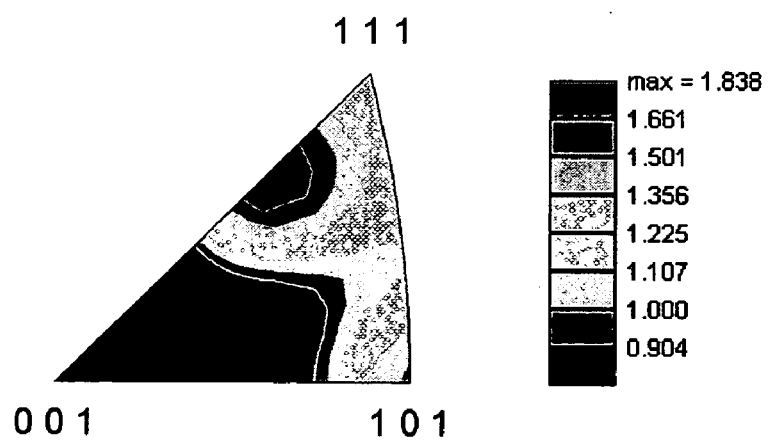
FIG. 15C illustrates a standard triangle of crystal orientation.

The orientation distribution of the crystalline semiconductor film obtained by using a catalyst element is shown in FIG. 15A and FIG. 15B. FIG. 15A and FIG. 15B are EBSP images obtained by identifying the crystal orientation of each minute region of the crystalline semiconductor film and mapping the orientation distribution of the crystalline semiconductor film. FIG. 15A is the orientation distribution of the crystalline semiconductor film of the present preferred embodiment, and FIG. 15B is a modified image of FIG. 15A where the individual crystal domains are more easily seen. Specifically, in FIG. 15B, same color is used for adjacent mapping points if the difference (angle) between the orientations of the adjacent mapping points is less than or equal to a predetermined degree (about 5° in the illustrated example). The term "crystal domain" as used herein refers to a region of substantially the same crystal orientation. FIG. 15C illustrates a standard triangle of crystal orientation as described above with reference to FIG. 14C. As can be seen from FIG. 15C, the crystalline semiconductor film of the present preferred embodiment is generally oriented in the <111> crystal zone planes, particularly along the (110) and (211) planes. The size of the individual crystal domains (regions each having a substantially uniform orientation) illustrated in FIG. 15B are distributed in the range of about 2 μm to about 10 μm. Thus, when a catalyst element is used, the crystal domains (regions each having a substantially uniform orientation) of the crystalline semiconductor film of the semiconductor layer typically have domain diameters of about 2 μm to about 10 μm. Note that the orientations, the proportion of orientations, and the domain diameters of the crystal domains set forth above are values based on EBSP.

It is preferred that the inclination angle of the protruding portion on the surface of the semiconductor layer is in the range of about 30° to about 70°. Moreover, it is preferred that the average surface roughness (Ra) of the semiconductor layer, as measured by an AFM (atomic force microscope), or the like, is about 4 nm to about 30 nm. In view of the preferred range of the average surface roughness (Ra), the average height of the protruding portions on the surface of the semiconductor layer is preferably in the range of about 8 nm to about 60 nm. The condition described above is obtained as a result of performing the melting/solidification process with laser light in a desirable manner, and a high-performance TFT having stable characteristics with little variations across the entire surface of the substrate can be obtained by maintaining such a condition.

First Preferred Embodiment

A semiconductor device according to the first preferred embodiment of the present invention and a method for manufacturing the same will now be described with reference to FIG. 1A to FIG. 1G. The first preferred embodiment is directed to a method for producing an n-channel TFT on a glass substrate. The TFT of the present preferred embodiment can be used not only in a driver circuit or a pixel section of an active matrix liquid crystal display device or an organic EL display device, but also as an element in a thin film integrated circuit. FIG. 1A to FIG. 1G are cross-sectional views sequentially illustrating steps for producing the n-channel TFT.

Figure 1A:
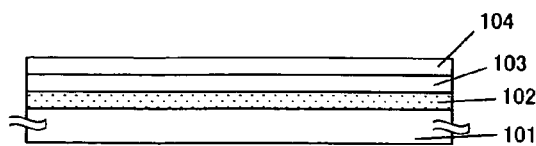
FIG. 1A to FIG. 1G are schematic cross-sectional views illustrating steps for manufacturing a semiconductor device according to a first preferred embodiment of the present invention.

Referring to FIG. 1A, a low-alkali glass substrate or a quartz substrate may be used as a substrate 101. A low-alkali glass substrate was used in the present preferred embodiment. In such a case, the substrate may be subjected to a pre-heat treatment at a temperature that is lower than the glass deformation point by about 10° C. to about 20° C. A base film such as a silicon oxide film, a silicon nitride film or a silicon oxide nitride film is formed on the TFT side of the substrate 101 for preventing the diffusion of an impurity from the substrate 101. In the present preferred embodiment, a silicon oxide nitride film was deposited, as a lower first base film 102, by a plasma CVD method using material gases of $SiH_4$, $NH_3$ and $N_2O$, and a second base film 103 was deposited on the first base film 102 similarly by a plasma CVD method using material gases of $SiH_4$ and $N_2O$. The thickness of the silicon oxide nitride film of the first base film 102 was set to about 25 nm to about 200 nm (e.g., about 100 nm), and the thickness of the silicon oxide nitride film of the second base film 103 was set to about 25 nm to about 300 nm (e.g., about 100 nm). Then, an intrinsic (I type) amorphous silicon film (a-Si film) 104 having a thickness of about 20 nm to about 80 nm (e.g., about 50 nm) and including a rare gas element is deposited by a plasma CVD method. In the present preferred embodiment, the first base film 102, the second base film 103 and the a-Si film 104 were deposited successively without exposing the substrate to the atmospheric air by using a multi-chamber plasma CVD apparatus.

Then, a heat treatment is performed at a temperature of about 400° C. to about 500° C. (e.g., about 450° C.) for about 1 hour, thereby performing a so-called "dehydrogenation process" of reducing the concentration of hydrogen present in the a-Si film 104. The dehydrogenation process is performed for the purpose of preventing bumping of hydrogen in the Si film 104 in the subsequent crystallization step by laser irradiation, which may lead to delamination, peeling, etc.

Figure 1B:
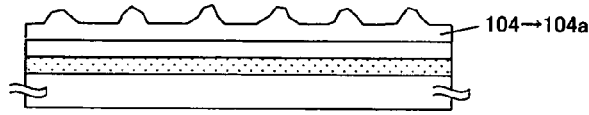

Then, as illustrated in FIG. 1B, the dehydrogenated a-Si film 104 is crystallized by being irradiated with laser light 105 so as to form the crystalline silicon film 104a. The laser light used in this step may be XeCl excimer laser (wavelength: 308 nm, pulse width: 40 nsec) or KrF excimer laser (wavelength: 248 nm). Within the period of the pulse width, the Si film 104 is instantaneously heated and melted, and is crystallized as it is solidified. In the melting/solidification process, the volume is increasing from a previously solidified portion (crystal nucleus) to a lastly solidified portion (crystal grain boundary portion) due to the difference in volumetric expansion coefficient between a melted portion and a solidified portion, whereby a ridge is formed in the crystal grain boundary portion on the surface of the crystallized silicon film 104a. The laser light is shaped so as to form an elongated beam spot on the surface of the substrate 101 so that the substrate is crystallized across the entire surface thereof by being scanned with the laser beam in the direction that is substantially perpendicular to the longitudinal direction of the beam spot. The substrate surface is preferably scanned so that adjacent beam traces have an overlap therebetween and any point on the surface of the a-Si film 104 is scanned with laser light a plurality of times, thereby improving the uniformity. The laser light energy should be set in an appropriate range because a desirable crystallinity may not be obtained when the energy is too low and the crystallinity may vary significantly when it is too high. In the present preferred embodiment, the laser light irradiation step was performed with an energy density of about 350 to about 500 mJ/cm$^2$ (e.g., about 420 mJ/cm$^2$) so that any point on the surface of the a-Si film 104 receives 10 to 40 shots (e.g., 20 shots) of laser light irradiation, thereby obtaining a crystalline silicon film having crystal grain diameters of about 200 nm to about 500 nm with an average grain diameter of about 300 nm. It is preferred that the average surface roughness Ra of the crystalline silicon film 104b is about 4 nm to about 9 nm (about 6 nm in the present preferred embodiment). Moreover, it is preferred that the inclination angle of the protruding portion (ridge) in the surface irregularities of the crystalline silicon film is in the range of about 30° to about 70° (about 40° to about 50° in the present preferred embodiment).

Figure 1C:
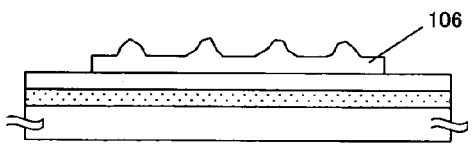
Figure 1D:
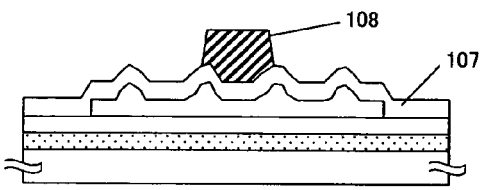

Then, a device isolation process is performed by removing unnecessary portions of the crystalline silicon film 104a. Through this step, an island-shaped crystalline silicon film 106 is formed, as illustrated in FIG. 1C. The island-shaped crystalline silicon film 106 will later be the semiconductor layer (the source/drain regions and the channel region) of the TFT.

Then, a silicon oxide film having a thickness of about 20 nm to about 150 nm (about 100 nm in the present preferred embodiment) is deposited, as a gate insulating film 107, so as to cover the crystalline silicon film 106 to be the active region. The silicon oxide film was formed by decomposing and depositing TEOS (Tetra Ethoxy Ortho Silicate) by an RF plasma CVD method with oxygen at a substrate temperature of about 150° C. to about 600° C. (preferably about 300° C. to about 450° C.). Alternatively, the silicon oxide film may be formed by a low-pressure CVD method or an atmospheric pressure CVD method using TEOS with an ozone gas at a substrate temperature of about 350° C. to about 600° C. (preferably about 400° C. to about 550° C.). After the deposition process, an annealing process may be performed in an inert gas atmosphere at about 500° C. to about 600° C. for approximately 1 to 4 hours in order to improve the bulk properties of the gate insulating film itself and the characteristics of the interface between the crystalline silicon film and the gate insulating film.

As described above, when the gate insulating film 107 is formed at a relatively low deposition temperature by a plasma CVD method using TEOS as a material, it is possible to improve the step-covering property of an insulating film 116 overlying the gate insulating film 107. Therefore, even if a gate electrode whose side surface inclination angle is nearly 90° is provided between the gate insulating film 107 and the insulating film 116, it is possible to prevent the metal line to be formed on the gate electrode from breaking at a step portion and to prevent a leak current at a step portion.

Alternatively, an SiN film may be formed as the gate insulating film 107, and an organic insulating film such as an acrylic film may be formed as the overlying insulating film 116 by a spin coating method. Then, the insulating film 116 has a desirable step-covering property, thereby providing effects similar to those described above. Note that in order to prevent thermal degradation of the organic insulating film, the hydrogenation of the channel portion by annealing at about 350° C. to about 450° C. is preferably performed after the formation of the underlying gate insulating film (SiN film) and before the formation of the overlying organic insulating film.

Then, a conductive film is deposited by a sputtering method and then patterned to form a gate electrode 108. The conductive film may be, for example, any of various metal films, or a semiconductor film doped with a donor or acceptor element at a high concentration. In the present preferred embodiment, a high-melting metal having a high heat resistance was used since a heat treatment is performed for activating the source/drain regions. The high-melting metal may be, for example, an element selected from tantalum (Ta), tungsten (W), molybdenum (Mo) and titanium (Ti), an alloy including one of these elements as its main component, or an alloy of these elements (typically, an Mo—W alloy or an Mo—Ta alloy). A low-melting metal such as aluminum (Al) may be used, in which case the activation can be done by laser irradiation. In the present preferred embodiment, tungsten (W) was deposited to a thickness of about 300 nm to about 600 nm (e.g., about 450 nm). The concentration of the impurity to be added for reducing the resistance is preferably low. When the oxygen concentration was set to about 30 ppm or less, a resistivity value of about 20 µΩcm or less was realized. Then, the deposited film is patterned in a photolithography process and etched so as to obtain the gate electrode 108. An RIE method was used for the etching step, and the gate electrode 108 was formed so that the side surface inclination angle thereof was about 75° to about 85°.

Figure 1E:
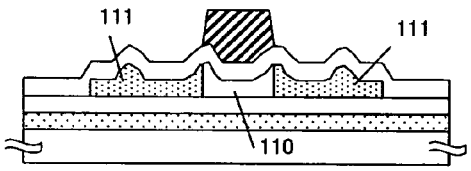

Then, as illustrated in FIG. 1E, a low concentration of an impurity (phosphorus) 109 is implanted into the semiconductor layer by an ion doping method using the gate electrode 108 as a mask. Phosphine ($PH_3$) is used as the doping gas, the acceleration voltage is set to about 60 kV to about 90 kV (e.g., about 80 kV), and the dose is set to about $1\times10^{12}$ $cm^{-2}$ to about $1\times10^{14}$ $cm^{-2}$ (e.g., about $8\times10^{12}$ $cm^{-2}$). Through this step, a low concentration of phosphorus 109 is implanted into a region 111 of the island-shaped silicon film 106 that is not covered with the gate electrode 108, and a region 110 that is masked with the gate electrode 108 and is not doped with phosphorus 109 will later be the channel region of the TFT.

Figure 1F:
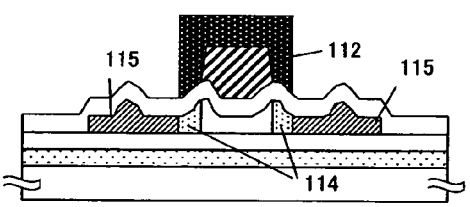

Then, a photoresist doping mask 112 with a thick side wall is arranged so as to cover the gate electrode 108, as illustrated in FIG. 1F. Then, a high concentration of an impurity (phosphorus) 113 is implanted into the semiconductor layer by an ion doping method using the resist mask 112. Phosphine ($PH_3$) is used as the doping gas, the acceleration voltage is set to about 60 kV to about 90 kV (e.g., about 80 kV), and the dose is set to about $1\times10^{15}$ $cm^{-2}$ to about $8\times10^{15}$ $cm^{-2}$ (e.g., about $2\times10^{15}$ $cm^{-2}$). The region doped with a high concentration of the impurity (phosphorus) 113 will later be a source/drain region 115 of the TFT. In the semiconductor layer 106, the region that is covered with the resist mask 112 and is not doped with a high concentration of phosphorus 113 is left as a region doped with a low concentration of phosphorus, which forms an LDD (Lightly Doped Drain) region 114. By forming the LDD region 114 as described above, the electric field localization at the junction between the channel region and the source/drain region is reduced, whereby it is possible to reduce the TFT off-state leak current and to suppress the deterioration due to hot carriers, thus improving the reliability of the TFT.

Then, after the photoresist 112 used as a doping mask is removed, a heat treatment is performed so as to activate the implanted impurity while improving the crystallinity of portions where the crystallinity has been deteriorated through the impurity introducing step as described above. The heat treatment may be performed with a resistive heating furnace, an RTA apparatus having a lamp, an RTA apparatus in which a high-temperature gas is blown onto the substrate, or by a laser irradiation method. In the present preferred embodiment, a heat treatment was performed using a common diffusion furnace at about 500° C. to about 600° C. (e.g., about 550° C.) for about 1 hour. The sheet resistance of the obtained n-type impurity (phosphorus) region 115 was about 500 Ω/square to about 800 Ω/square, and the sheet resistance of the LDD region 114 doped with a low concentration of phosphorus was about 30 kΩ/square to about 50 kΩ/square.

Figure 1G:
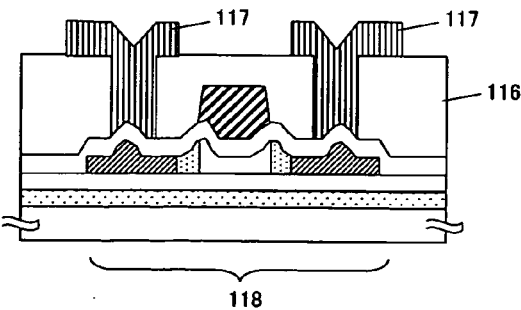

Then, as illustrated in FIG. 1G, a silicon oxide film or a silicon nitride film having a thickness of about 400 nm to about 1000 nm is formed as an interlayer insulating film 116. Then, contact holes are made in the interlayer insulating film 116, and an electrode/line 117 of the TFT is formed by using a metal film, e.g., a two-layer film of titanium nitride and aluminum. The titanium nitride film is a barrier film for preventing the diffusion of aluminum into the semiconductor layer. In a case where the thin film transistor TFT (118 in FIG. 1G) is used as a pixel TFT, a pixel electrode formed from a transparent conductive film such as ITO is connected to one of the two electrodes other than the gate electrode (i.e., the drain electrode). Finally, an annealing process is performed in a nitrogen atmosphere or a hydrogen atmosphere at about 350° C. for approximately 1 hour, thereby completing the thin film transistor (TFT) 118, as illustrated in FIG. 1G. As necessary, a protection film made of silicon nitride, or other suitable material, may be further provided on the thin film transistor (TFT) 118 for the purpose of protecting the TFT 118.

A TFT produced according to the preferred embodiment as described above had a field-effect mobility of about 8 $cm^2$/Vs and a threshold voltage of about 2.5 V, and had no abnormal humped curve of leak current while the TFT is off, which occurs in the prior art. Moreover, substantially no characteristics deterioration was observed in tests for determining the resistance to repeated operations, the resistance to bias voltages and the resistance to thermal stresses, indicating a much higher reliability as compared to the prior art. TFTs having a dual-gate structure were produced according to the present preferred embodiment and used as pixel TFTs on the active matrix substrate of a liquid crystal display panel. The obtained liquid crystal panel, as compared with a reference panel produced by a conventional method, had a high display quality with a notably lower rate of occurrence of low-luminance bright spots, a notably lower display non-uniformity, and a high contrast ratio.

Moreover, TFTs produced according to the present preferred embodiment included very few defective TFTs with an abnormal leak current, with the defect rate being on the order of approximately 0.0001% (about one pixel out of every 300,000 pixels in the case of a liquid crystal display device).

Second Preferred Embodiment

A semiconductor device according to the second preferred embodiment of the present invention and a method for manufacturing the same will now be described. The present preferred embodiment is directed to a process of producing, on a glass substrate, a circuit having a CMOS structure including a complementary set of an n-channel TFT and a p-channel TFT, which is used in a peripheral driving circuit of an active matrix liquid crystal display device or a general thin film integrated circuit.

FIG. 2A to FIG. 2F and FIG. 3A to FIG. 3D are cross-sectional views sequentially illustrating steps for producing the TFTs of the present preferred embodiment.

First, a base film such as a silicon oxide film, a silicon nitride film or a silicon oxide nitride film is formed on the TFT side of a glass substrate 201 for preventing the diffusion of an impurity from the substrate 201. In the present preferred embodiment, a silicon oxide nitride film (first base film) 202 is preferably formed from $SiH_4$, $NH_3$ and $N_2O$ with a thickness of about 100 nm by a plasma CVD method, for example, and a silicon oxide nitride film (second base film) 203 is preferably similarly formed from $SiH_4$ and $N_2O$ with a thickness of about 100 nm.

Then, an amorphous semiconductor film having a thickness of about 20 nm to about 150 nm (preferably about 30 nm to about 70 nm) is formed by a known method such as a plasma CVD method or a sputtering method. In the present preferred embodiment, an amorphous silicon (a-Si) film 204 was formed to a thickness of about 40 nm by a plasma CVD method. The amorphous semiconductor film may be an amorphous semiconductor film or a microcrystalline semiconductor film. Since the base films 202 and 203 and the a-Si film 204 can be formed by the same deposition method, they may alternatively be formed successively. By not exposing the base films to the atmosphere after they are formed, it is possible to prevent the contamination of the surface of the base films, thereby reducing the characteristics variations among TFTs produced and the fluctuations in the threshold voltage. This state is shown in FIG. 2A.

Then, as in the first preferred embodiment, the a-Si film 204 is subjected to a dehydrogenation process, and then irradiated with laser light 205 as illustrated in FIG. 2B so as to instantaneously melt and then crystallize the a-Si film 204. Thus, the a-Si film 204 is turned into a crystalline silicon film 204a. The laser light used in this step may be XeCl excimer laser (wavelength: 308 nm, pulse width: 40 nsec) or KrF excimer laser (wavelength: 248 nm). In this step, surface irregularities/ridges are formed on the surface of the crystallized silicon film 204a. Laser light emitted from a laser cavity is focused by an optical system into a linear shape so as to form an elongated beam spot on the surface of the substrate 201 so that the substrate is crystallized across the entire surface thereof by being scanned with the laser beam in the direction that is substantially perpendicular to the longitudinal direction of the beam spot. The substrate surface is preferably scanned so that adjacent beam traces have an overlap therebetween and any point on the surface of the a-Si film 204 is scanned with laser light a plurality of times, thereby improving the uniformity. In the present preferred embodiment, the laser light irradiation step was performed with an energy density of about 350 mJ/cm$^2$ to about 500 mJ/cm$^2$ (e.g., about 420 mJ/cm$^2$) so that any point on the surface of the a-Si film 204 receives 10 to 40 shots (e.g., 20 shots) of laser light irradiation, thereby obtaining a crystalline silicon film having crystal grain diameters of about 200 nm to about 500 nm with an average grain diameter of about 300 nm. It is preferred that the average surface roughness Ra of the crystalline silicon film 104b is about 4 nm to about 9 nm (about 6 nm in the present preferred embodiment). Moreover, it is preferred that the inclination angle of the protruding portion (ridge) in the surface irregularities of the crystalline silicon film is in the range of about 30° to about 70° (about 40° to about 50° in the present preferred embodiment). The laser light used in this step may be YAG laser or YVO$_4$ laser as well as excimer laser as described above. The crystallization conditions are not limited to those of the present preferred embodiment, and may be determined appropriately for each specific application.

Then, as illustrated in FIG. 2C, the crystalline silicon film 204a is divided into pieces. of a predetermined shape, thereby forming island-shaped semiconductor layers 206n and 206p.

Boron (B) may be added, as an impurity element giving p-type conductivity, to the entire surface of the island-shaped semiconductor layers 206n and 206p, each of which is used to form a TFT, at a concentration of about $1\times10^{16}$/cm$^3$ to about $5\times10^{17}$/cm$^3$ for the purpose of controlling the threshold voltage. Boron may be added by an ion doping method, or may alternatively be added to the amorphous silicon film when the amorphous silicon film is deposited. Alternatively, a low concentration of boron may be added only to the semiconductor layer 206n of the n-channel TFT, while covering the semiconductor layer 206p of the p-channel TFT with a photoresist, for the purpose of controlling the threshold voltage of only the n-channel TFT. Although the addition of boron may be optional, it is preferred that a semiconductor layer with boron added thereto is provided so that the threshold voltage of the n-channel TFT will be within a predetermined range.

Then, a silicon-containing insulating film, as a gate insulating film 207, is formed to a thickness of about 10 nm to about 150 nm by a plasma CVD method or a sputtering method. For example, a silicon oxide film may be formed to a thickness of about 100 nm. The gate insulating film 207 may alternatively be any other suitable silicon-containing insulating film and may be a single-layer film or a multi-layer film.

Then, a conductive film (A) 208 and a conductive film (B) 209 are deposited for forming a gate electrode. In the present preferred embodiment, the conductive layer (A) 208 is preferably formed from a conductive metal nitride film and the conductive layer (B) 209 is preferably formed from a metal film. The material of the conductive layer (B) 209 may be an element selected from tantalum (Ta), titanium (Ti), molybdenum (Mo) and tungsten (W), an alloy including one of these elements as its main component, or an alloy of these elements (typically, an Mo—W alloy or an Mo—Ta alloy), and the material of the conductive layer (A) 208 may be tantalum nitride (TaN), tungsten nitride (WN), titanium nitride (TiN) or molybdenum nitride (MoN). Alternative materials of the conductive layer (A) 208 include tungsten silicides, titanium silicides and molybdenum silicides. The conductive layer (B) 209 preferably has a low impurity concentration for realizing a low resistance. Particularly, it was desirable that the oxygen concentration was about 30 ppm or less. With tungsten (W), for example, a resistivity value of about 20 µΩcm or less was realized by setting the oxygen concentration to about 30 ppm or less.

The thickness of the conductive layer (A) 208 may be about 10 nm to about 50 nm (preferably, about 20 nm to about 30 nm), and the thickness of the conductive layer (B) 209 may be about 200 nm to about 400 nm (preferably, about 250 nm to about 350 nm). In the present preferred embodiment, a tantalum nitride (TaN) film having a thickness of about 30 nm and a tungsten (W) film having a thickness of about 350 nm were formed by a sputtering method as the conductive layer (A) 208 and the conductive layer (B) 209, respectively. In the sputtering deposition process, it is possible to relax the internal stress of the film being formed to prevent delamination of the film by adding an appropriate amount of Xe or Kr to the Ar sputtering gas. This state is shown in FIG. 2D.

Then, as illustrated in FIG. 2E, resist masks 210n and 210p are formed, and a first etching process is performed for forming the gate electrode and the gate line (scanning line) of each TFT. In the present preferred embodiment, the first etching process was performed under first etching conditions. Specifically, the first etching process was performed by an ICP (Inductively Coupled Plasma) etching method using etching gases of CF$_4$, Cl$_2$ and O$_2$ at a flow rate ratio of 25/25/10 (sccm) and by creating a plasma by supplying an RF (13.56 MHz) power of 500 W through a coil electrode at a pressure of 1 Pa. Also to the substrate (sample stage), an RF (13.56 MHz) power of 150 W is supplied, thereby substantially applying a negative self-bias voltage. Under these first etching conditions, the W film was etched to taper the edge portions of the conductive layer (B) 209. Thus, the conductive layer (B) 209 is patterned into pieces 212n and 212p.

Then, a second etching process was performed under the second etching conditions without removing the masks 210n and 210p. Specifically, the second etching process was performed for about 30 seconds by using etching gases of CF$_4$ and Cl$_2$ at a flow rate ratio of 30/30 (sccm) and by creating a plasma by supplying an RF (13.56 MHz) power of 500 W through a coil electrode at a pressure of 1 Pa. Also to the substrate, an RF (13.56 MHz) power of 20 W is supplied, thereby substantially applying a negative self-bias voltage. Thus, the conductive film (A) (TaN film) 208 is etched under the second etching conditions in a mixed atmosphere of $CF_4$ and $Cl_2$. Through the etching process, the conductive film (A) 208 is patterned into pieces 211n and 211p whose edges have side surface inclination angles of about 80° to about 90°. This state is shown in FIG. 2F.

Figure 3A:
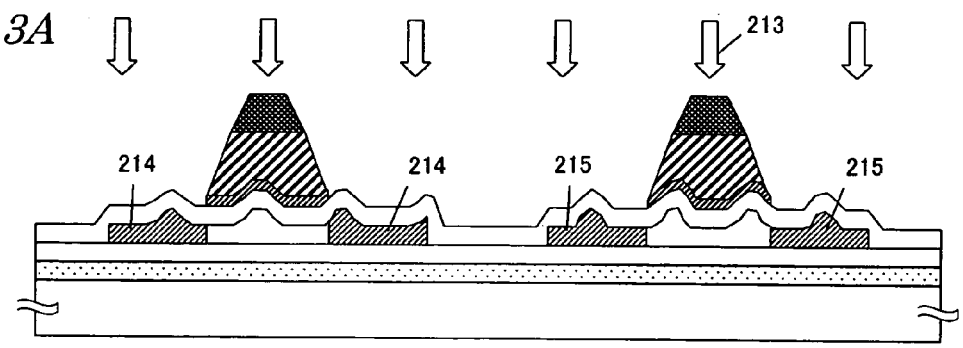
FIG. 3A to FIG. 3D are schematic cross-sectional views illustrating steps for manufacturing a semiconductor device according to the second preferred embodiment of the present invention (continued from FIG. 2F).

Then, as illustrated in FIG. 3A, an n-type impurity element 213 is added without removing the masks 210n and 210p, thereby forming n-type impurity regions 214 and 215. The n-type impurity element may be phosphorus (P) or arsenic (As). In the present preferred embodiment, an ion doping process was performed with phosphine ($PH_3$) so as to add phosphorus (P). In this process, the acceleration voltage is set to about 50 kV to about 80 kV (e.g., about 70 kV), and the dose is set to about $1\times10^{15}$ cm$^{-2}$ to about $8\times10^{15}$ cm$^{-2}$ (e.g., about $2\times10^{15}$ cm$^{-2}$). In this step, regions of the island-shaped semiconductor layers 206n and 206p covered with the TaN films 211n and 211p and the W films 212n and 212p, which function as doping masks, are not doped with a high concentration of phosphorus 213.

Figure 3B:
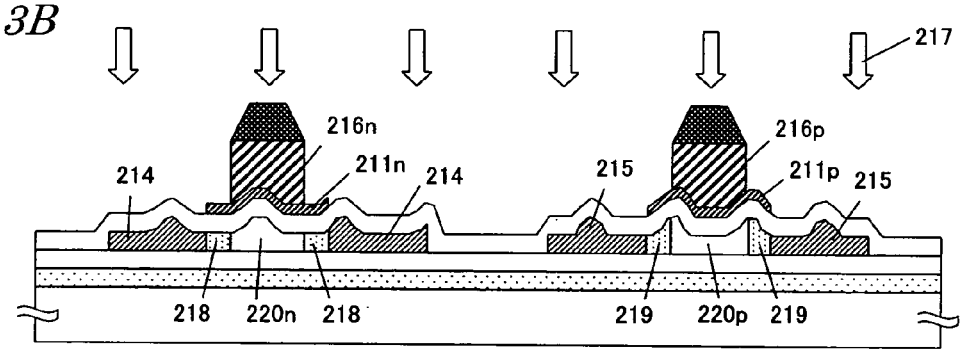

Then, a third etching process is performed without removing the masks 210n and 210p. Specifically, the third etching process is performed by using etching gases of $CF_4$, $Cl_2$ and $O_2$ at a flow rate ratio of 20/20/20 (sccm) and by supplying an RF (13.56 MHz) power of 500 W through a coil electrode at a pressure of 1 Pa, thereby substantially applying a negative self-bias voltage. Under the third etching conditions, the W films 212n and 212p are selectively etched with an anisotropy. In this process, the TaN films 211n and 211p are not etched, and only the W films 212n and 212p are etched laterally, thereby forming W films 216n and 216p. As a result, each edge of the etched W films 216n and 216p has a side surface inclination angle of about 80° to about 90°. Thus, gate electrodes 216n/211n and 216p/211p are obtained, as illustrated in FIG. 3B, each having a layered and stepped structure including a W film and a TaN film.

Then, a low concentration of n-type impurity element 217 is added to the semiconductor layer. Another doping process is performed using, as a mask, the upper conductive films (W films) 216n and 216p of the gate electrode obtained through a plurality of etching processes as described above so that even the underlying semiconductor layer is doped with an n-type impurity element in regions where the lower conductive films (TaN films) 211n and 211p are exposed, thereby forming lightly-doped n-type impurity regions 218 and 219. In the present preferred embodiment, phosphine ($PH_3$) is used as the doping gas, the acceleration voltage is set to about 80 kV to about 100 kV (e.g., about 90 kV), and the dose is set to about $5\times10^{12}$ cm$^{-2}$ to about $5\times10^{14}$ cm$^{-2}$ (e.g., about $1\times10^{14}$ cm$^{-2}$). Through this step, a region 220n of the island-shaped semiconductor layer 206n of the n-channel TFT that is covered with the upper conductive film (W film) 216n of the gate electrode and is not doped with phosphorus will later be the channel region of the n-channel TFT. The region 218 of the semiconductor layer 206n over which only the lower conductive film (TaN film) 211n of the gate electrode is present will later be the LDD region, and the region 214 that is not masked with the lower conductive film 211n will later be the source/drain region. The concentration of the impurity (phosphorus (P)) of the source/drain region 214 may be about $1\times10^{20}$/cm$^3$ to about $1\times10^{21}$/cm$^3$. Moreover, the impurity concentration of the LDD region 218 may be about $5\times10^{17}$/cm$^3$ to about $5\times10^{19}$/cm$^3$.

Figure 3C:
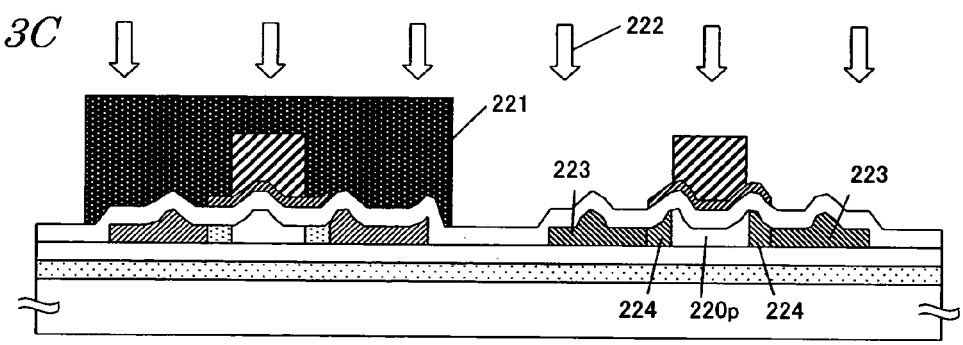

Then, as illustrated in FIG. 3C, after the resist masks 210n and 210p are removed, another resist mask 221 is formed so as to partially cover the semiconductor layer of the n-channel TFT. Then, the semiconductor layer 206p of the p-channel TFT is doped with a p-type impurity element (boron (B) in the present preferred embodiment) 222 so as to cancel the previously-added n-type impurity (phosphorus) and invert the polarity thereof ("counter doping"), thereby forming p-type impurity regions 223 and 224. Diborane ($B_2H_6$) is used as the doping gas, the acceleration voltage is set to about 60 kV to about 90 kV (e.g., about 80 kV), and the dose is set to about $5\times10^{15}$ cm$^{-2}$ to about $2\times10^{16}$ cm$^{-2}$ (e.g., about $1\times10^{16}$ cm$^{-2}$). Through this step, a high concentration of boron 222 is implanted into the region 223 of the island-shaped semiconductor layer 206p of the p-channel TFT that is not masked with the lower conductive film (TaN film) 211p of the gate electrode, and the region 223 will later be the source/drain region of the p-channel TFT. Moreover, in the region 224 over which only the lower conductive film (TaN film) 211p of the gate electrode is present, the doping ion range is extended by the thickness of the TaN film, and the amount of boron to be actually implanted into the region 224 is smaller than in the source/drain regions 223, whereby the region 224 will later be the LDD region of the p-channel TFT. Moreover, a region 220p that is covered with the upper conductive film (W film) 216p of the gate electrode and is not doped with boron will later be the channel region of the p-channel TFT. The concentration of the impurity (phosphorus) of the source/drain region 223 may be about $1\times10^{20}$/cm$^3$ to about $1\times10^{21}$/cm$^3$. Moreover, the doping process may be performed in two separate steps using different acceleration voltages for the source/drain region and for the LDD region. In this process, the semiconductor layer of the n-channel TFT, which is covered with the mask 221, is not at all doped with boron 222. Thus, an n-channel TFT and a p-channel TFT can be produced together.

Then, the impurity elements added to the semiconductor layers are activated. This activation step is performed by using an annealing furnace. The thermal annealing process is performed in a nitrogen atmosphere whose oxygen concentration is about 1 ppm or less (preferably, about 0.1 ppm or less) at a temperature of approximately 400° C. to 700° C. (typically about 500° C. to about 550° C.). In the present preferred embodiment, the activation process was performed by annealing at about 550° C. for approximately 4 hours. Note that a laser annealing method or a rapid thermal annealing (RTA) method may be used as well as the thermal annealing method.

Then, the mask 221 is removed, and an interlayer insulating film is formed. A silicon nitride film, a silicon oxide film or a silicon nitride oxide film is preferably formed to a thickness of about 300 to about 1000 nm. In the present preferred embodiment, a silicon nitride film 225 having a thickness of about 200 nm and a silicon oxide film 226 having a thickness of about 700 nm were deposited on one another, thereby providing a two-layer film. The deposition process is performed by a plasma CVD method to continuously form the silicon nitride film using $SiH_4$ and $NH_3$ as material gases, and the silicon oxide film using TEOS and $O_2$ as material gases. Needless to say, the interlayer insulating film is not limited to this, but may alternatively be any other suitable silicon-containing insulating film and may be a single-layer film or a multi-layer film.

Then, another heat treatment is performed at about 300° C. to about 500° C. for about 1 to several hours as a step of hydrogenating the semiconductor layer. This step is performed for terminating and inactivating dangling bonds that deteriorate the TFT characteristics by supplying hydrogen atoms to the interface between the active region and the gate insulating film. In the present preferred embodiment, a heat treatment was performed in a nitrogen atmosphere containing about 3% of hydrogen at approximately 410° C. for about 1 hour. When a sufficient amount of hydrogen is contained in the interlayer insulating film (particularly the silicon nitride film 225), the effect can be obtained also by performing the heat treatment in a nitrogen atmosphere. Other hydrogenation processes that can be used include a plasma hydrogenation process (using hydrogen excited by a plasma).

Figure 3D:
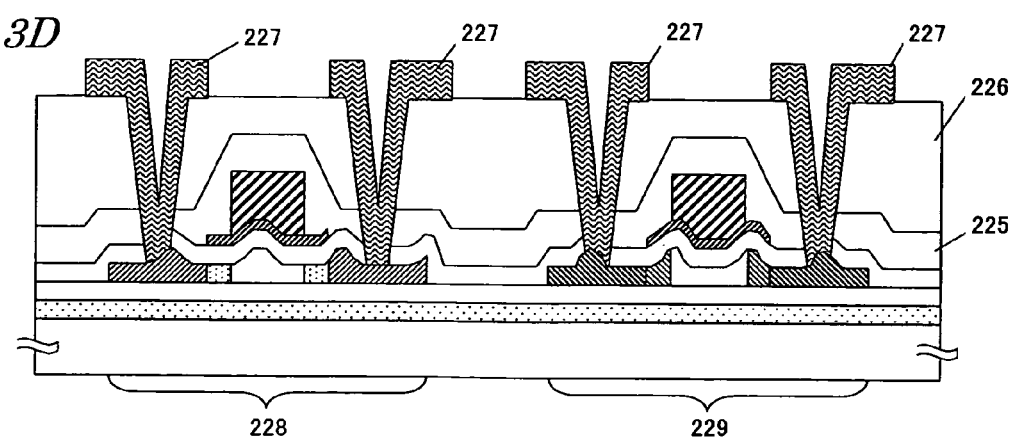

Then, contact holes are made in the interlayer insulating film, and an electrode/line 227 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel thin film transistor (TFT) 228 and a p-channel thin film transistor (TFT) 229 as illustrated in FIG. 3D. As necessary, additional contact holes may be made over the gate electrodes 216n and 216p for providing necessary connection between electrodes with the line 227. Moreover, a protection film made of silicon nitride, or other suitable material, may be further provided on each TFT for the purpose of protecting the TFT.

TFTs produced according to the present preferred embodiment as described above exhibited substantially no abnormal increase in the TFT off-state leak current, which frequently occurs in the prior art, and substantially no characteristics deterioration was observed in tests for determining the resistance to repeated operations, the resistance to bias voltages and the resistance to thermal stresses. Moreover, as a CMOS circuit having a complementary set of an n-channel TFT and a p-channel TFT produced according to the present preferred embodiment was used in various circuits such as an inverter chain and a ring oscillator, the circuits exhibited a much higher reliability and more stable circuit characteristics over the prior art.

Moreover, TFTs produced according to the present preferred embodiment included very few defective TFTs with an abnormal leak current, with the defect rate being on the order of about 0.0001%.

Third Preferred Embodiment

A semiconductor device according to the third preferred embodiment of the present invention and a method for manufacturing the same will now be described. The present preferred embodiment is also directed to a process of producing, on a glass substrate, a circuit having a CMOS structure including a complementary set of an n-channel TFT and a p-channel TFT, which is used in a peripheral driving circuit of an active matrix liquid crystal display device or a general thin film integrated circuit.

FIG. 4A to FIG. 4F and FIG. 5A to FIG. 5E are cross-sectional views sequentially illustrating steps for producing the TFTs of the present preferred embodiment.

Figure 4A:
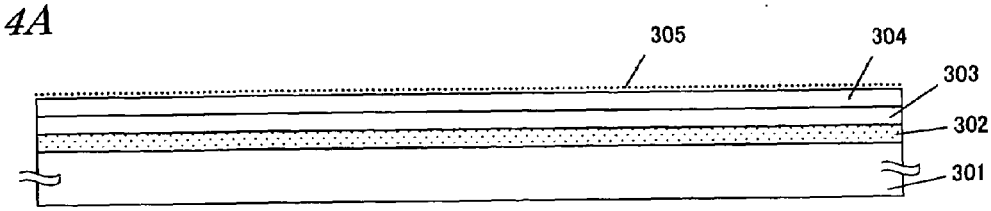
FIG. 4A to FIG. 4F are schematic cross-sectional views illustrating steps for manufacturing a semiconductor device according to a third preferred embodiment of the present invention.

Referring to FIG. 4A, a low-alkali glass substrate was used as a substrate 301. In such a case, the substrate may be subjected to a pre-heat treatment at a temperature that is lower than the glass deformation point by about 10° C. to about 20° C. A base film such as a silicon oxide film, a silicon nitride film or a silicon oxide nitride film is formed on the TFT side of the substrate 301 for preventing the diffusion of an impurity from the substrate 301. In the present preferred embodiment, a silicon oxide nitride film was deposited, as a lower first base film 302, by a plasma CVD method using material gases of $SiH_4$, $NH_3$ and $N_2O$, and a second base film 303 was deposited on the first base film 302 similarly by a plasma CVD method using material gases of $SiH_4$ and $N_2O$. The thickness of the silicon oxide nitride film of the first base film 302 was set to about 25 nm to about 200 nm (e.g., about 50 nm), and the thickness of the silicon oxide nitride film of the second base film 303 was set to about 25 nm to about 300 nm (e.g., about 100 nm). While a two-layer base film is preferably used in the present preferred embodiment, a single-layer silicon oxide film, for example, may alternatively be used. Then, an amorphous silicon film (a-Si film) 304 having a thickness of about 20 nm to about 150 nm (preferably about 30 nm to about 80 nm) is formed by a known method such as a plasma CVD method. In the present preferred embodiment, an amorphous silicon film was formed to a thickness of about 50 nm. Moreover, the base films 302 and 303 and the amorphous silicon film 304 may be formed successively. By not exposing the base films to the atmosphere after they are formed, it is possible to prevent the contamination of the surface of the base films, thereby reducing the characteristics variations among TFTs produced and the fluctuations in the threshold voltage.

Then, a small amount of a catalyst element (preferably nickel in the present preferred embodiment) 306 is added to the surface of the a-Si film 304. The catalyst element to be used is preferably one or more element selected from nickel (Ni), cobalt (Co), tin (Sn), lead (Pb), palladium (Pd), iron (Fe) and copper (Cu). Alternatively, ruthenium (Ru), rhodium (Rh), osmium (Os), iridium (Ir), platinum (Pt), gold (Au), etc., may be used. The addition of a small amount of nickel 306 was performed by holding a nickel solution on the a-Si film 304, uniformly spreading the solution across the substrate 301 by a spinner, and then drying the substrate 301. In the present preferred embodiment, nickel acetate was used as the solute, water was used as the solvent, and the nickel concentration in the solution was controlled to be about 8 ppm. This state is shown in FIG. 4A. Note that prior to this step, the surface of the a-Si film 304 may be slightly oxidized with ozone water, or the like, so as to improve the wettability of the surface of the a-Si film 304 in the spin application. The concentration of added nickel on the surface of the a-Si film 304 in the state as illustrated in FIG. 4A was about $4\times10^{12}$ atoms/cm$^2$, as measured by a total reflection X-ray fluorescence (TRXRF) method. Methods for adding a catalyst element to an amorphous silicon film include, in addition to the method of applying a solution containing the catalyst element, vapor-phase application methods such as a plasma doping method, a vapor deposition method and a sputtering method. When a solution is used, it is easy to control the amount of the catalyst element to be added, and very small amounts of the catalyst element can easily be added.

Figure 4B:
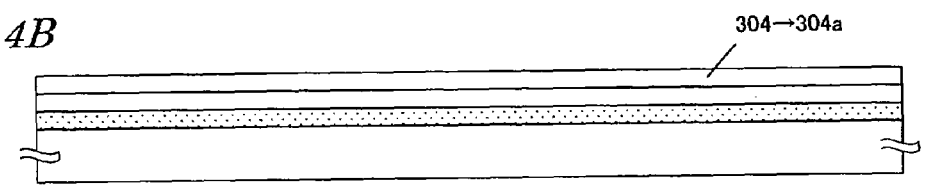

Then, a first heat treatment is performed in an inert atmosphere (e.g., a nitrogen atmosphere). The heat treatment is performed at about 520° C. to about 600° C. for approximately 1 to 8 hours. In the present preferred embodiment, the heat treatment was performed at about 580° C. for approximately 1 hour. In this heat treatment, nickel 306 added to the surface of the a-Si film 304 diffuses into the a-Si film 304 while being silicified, and the crystallization of the a-Si film 304 proceeds using the silicide as nuclei. As a result, the a-Si film 304 is crystallized into a crystalline silicon film 304a, as illustrated in FIG. 4B. Note that while the crystallization process is herein performed in a heat treatment using a furnace, it may alternatively be performed by an RTA (Rapid Thermal Annealing) apparatus using a lamp, or the like, as a heat source. In the obtained crystalline silicon film 304a, the orientated crystal planes are primarily planes of <111> crystal zone, and about 50% or more of the regions that are oriented along the <111> crystal zone planes are regions that are oriented along the (110) plane or the (211) plane. Moreover, the crystal domains (regions each having a substantially uniform orientation) of the obtained crystalline silicon film 304a have domain diameters of about 2 μm to about 10 μm.

Figure 4C:
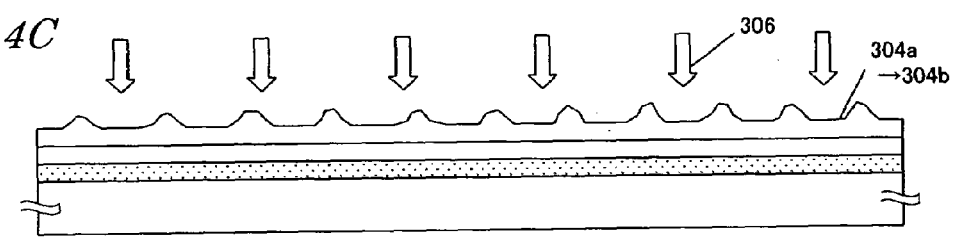

Then, as illustrated in FIG. 4C, the crystalline silicon film 304a is irradiated with laser light 306 to further crystallize the crystalline silicon film 304a, thereby improving the crystallinity thereof. In this step, XeCl excimer laser (wavelength: 308 nm, pulse width: 40 nsec) was used as the laser light. The laser light irradiation was performed with an energy density of about 350 mJ/cm$^2$ to about 500 mJ/cm$^2$ (e.g., about 430 mJ/cm$^2$). The laser light was shaped so as to form an elongated beam spot having a size of about 150 mm by about 1 mm on the surface of the substrate 301, and the substrate 301 was scanned in the direction that is substantially perpendicular to the longitudinal direction of the beam spot and in a line sequential manner with a step width of about 0.05 mm. Thus, any point on the crystalline silicon film 304a is irradiated with laser light a total of 20 times. The crystalline silicon film 304a obtained by solid-phase crystallization as described above is turned into a crystalline silicon film 304b of a higher quality as the crystal defects are reduced through the melting/solidification process by the laser irradiation. After the laser irradiation process, the crystal orientation of the obtained crystalline silicon film 304b remains to be that of the crystalline silicon film 304a before the laser irradiation. However, ridges have been formed through the melting/solidification process by laser irradiation on the surface of the crystalline silicon film 304b with an average surface roughness Ra of about 4 nm to about 9 nm. The inclination angle of the protruding portions (ridges) in the surface irregularities of the crystalline silicon film 304b is preferably about 30° to about 70° (about 45° in the present preferred embodiment).

Figure 4D:
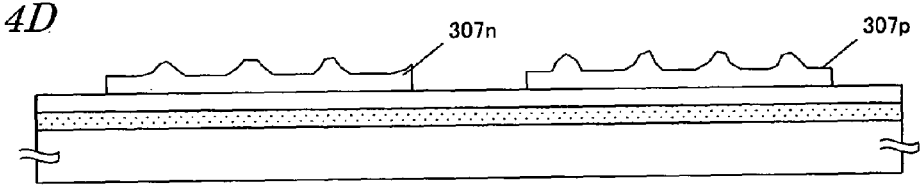

Then, a device isolation process is performed by removing unnecessary portions of the crystalline silicon film 304b. Through this step, island-shaped crystalline silicon films 307n and 307p are formed, as illustrated in FIG. 4D. The island-shaped crystalline silicon films 307n and 307p will later be the active regions (the source/drain regions and the channel regions) of the n-channel TFT and the p-channel TFT, respectively.

Boron (B) may be added, as an impurity element giving p-type conductivity, to the entire surface of the active regions of the n-channel TFT and the p-channel TFT at a concentration of about 1×10$^{16}$/cm$^3$ to 5×10$^{17}$/cm$^3$ for the purpose of controlling the threshold voltage. Boron (B) may be added by an ion doping method, or may alternatively be added to the amorphous silicon film when the amorphous silicon film is deposited.

Then, a silicon oxide film having a thickness of about 20 nm to about 150 nm (about 100 nm in the present preferred embodiment) is deposited, as a gate insulating film 308, so as to cover the crystalline silicon films 307n and 307p to define the active regions. The silicon oxide film was formed by decomposing and depositing TEOS by an RF plasma CVD method with oxygen at a substrate temperature of about 300° C. to about 450° C. The gate insulating film 308 may alternatively be any other suitable silicon-containing insulating film and may be a single-layer film or a multi-layer film.

Figure 4E:
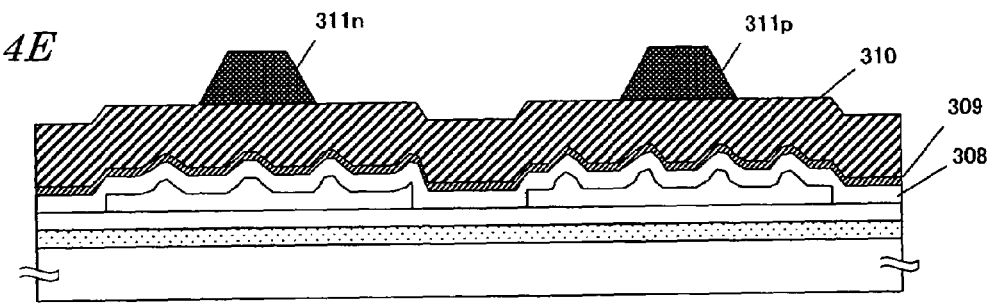

Then, a conductive film (A) 309 and a conductive film (B) 310 are deposited for forming a gate electrode. The thickness of the conductive layer (A) 309 may be about 10 nm to about 50 nm (preferably, about 20 nm to about 40 nm), and the thickness of the conductive layer (B) 310 may be about 200 nm to about 500 nm (preferably, about 250 nm to about 450 nm). In the present preferred embodiment, a tantalum nitride (TaN) film having a thickness of about 30 nm and a tungsten (W) film having a thickness of about 400 nm were formed by a sputtering method as the conductive layer (A) 309 and the conductive layer (B) 310, respectively. Then, resist masks 311n and 311p are formed for forming the gate electrode by a patterning process, as illustrated in FIG. 4E.

Then, a first etching process is performed for forming the gate electrode and the gate line (scanning line) of each TFT. In the present preferred embodiment, the first etching process was performed under first etching conditions. Specifically, the first etching process was performed by an ICP (Inductively Coupled Plasma) etching method using etching gases of $CF_4$, $Cl_2$ and $O_2$ at a flow rate ratio of 25/25/10 (sccm) and by creating a plasma by supplying an RF (13.56 MHz) power of 500 W through a coil electrode at a pressure of 1 Pa. Also to the substrate (sample stage), an RF (13.56 MHz) power of 150 W is supplied, thereby substantially applying a negative self-bias voltage. The W film is etched under the first etching conditions so as to gently taper the edges of conductive layers (B) 313n and 313p.

Figure 4F:
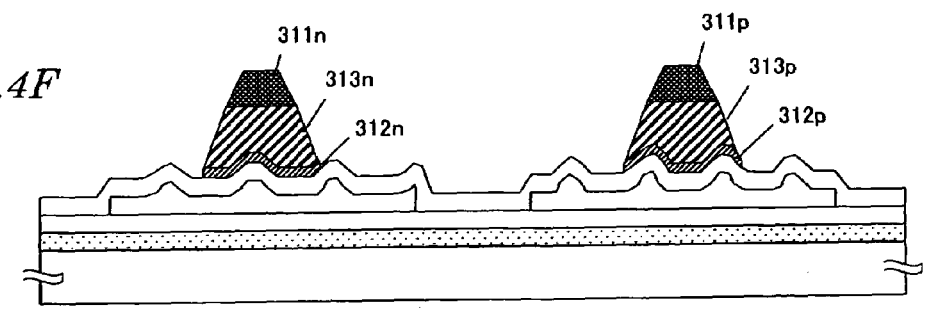

Then, a second etching process was performed under the second etching conditions without removing the masks 311n and 311p. Specifically, the second etching process was performed for about 30 seconds by using etching gases of $CF_4$ and $Cl_2$ at a flow rate ratio of 30/30 (sccm) and by creating a plasma by supplying an RF (13.56 MHz) power of 500 W through a coil electrode at a pressure of 1 Pa. Also to the substrate, an RF (13.56 MHz) power of 20 W is supplied, thereby substantially applying a negative self-bias voltage. Thus, the conductive film (A) (TaN film) 309 is etched under the second etching conditions in a mixed atmosphere of $CF_4$ and $Cl_2$. After the etching process, TaN films 312n and 312p are formed whose edges have side surface inclination angles of about 80° to about 90°. This state is shown in FIG. 4F.

Figure 5A:
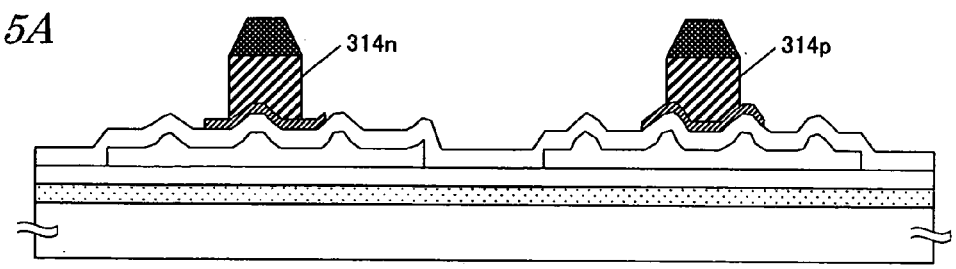
FIG. 5A to FIG. 5E are schematic cross-sectional views illustrating steps for manufacturing a semiconductor device according to the third preferred embodiment of the present invention (continued from FIG. 4F).

Then, a third etching process is performed. Specifically, the third etching process is performed by using etching gases of $CF_4$, $Cl_2$ and $O_2$ at a flow rate ratio of 20/20/20 (sccm) and by supplying an RF (13.56 MHz) power of 500 W through a coil electrode at a pressure of 1 Pa, thereby substantially applying a negative self-bias voltage. Under the third etching conditions, the W films 313n and 313p are selectively etched with an anisotropy. In this process, the TaN films 312n and 312p are not etched, and only the W films 313n and 313p are etched laterally, thereby forming W films 314n and 314p. As a result, each edge of the etched W films 314n and 314p has a side surface inclination angle of about 80° to about 90°. Thus, gate electrodes 314n/312n and 314p/312p are obtained, as illustrated in FIG. 5A, each having a layered and stepped structure including a W film and a TaN film. These three etching processes may be performed successively in an etching apparatus. In the present preferred embodiment, the three-step etching process was performed continuously in an ICP etching chamber while successively changing the etching conditions from the first to the second and then to the third etching conditions.

Figure 5B:
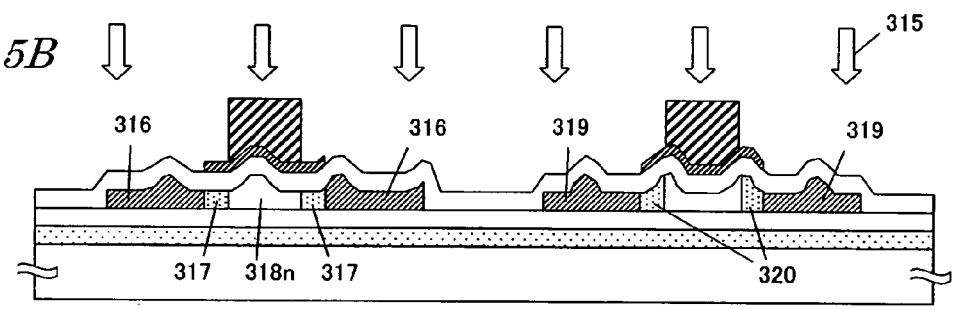

Then, as illustrated in FIG. 5B, after the resist masks 311n and 311p are removed, an n-type impurity (phosphorus) 315 is implanted into the semiconductor layers 307n and 307p by an ion doping method using the gate electrodes 314n/312n and 314p/312p, which are in a two-layer stepped structure, as masks. In the present preferred embodiment, the phosphorus 315 doping process was performed in two separate steps using different acceleration voltages and different doses. Phosphine ($PH_3$) was used as the doping gas. In the first doping step, the acceleration voltage was set to about 40 kV to about 80 kV (e.g., about 60 kV) and the dose was set to about $1\times10^{15}$ $cm^{-2}$ to about $2\times10^{16}$ $cm^{-2}$ (e.g., about $6\times10^{15}$ $cm^{-2}$). In the second doping step, the acceleration voltage was set to about 80 kV to about 100 kV (e.g., about 90 kV) and the dose was set to about $5\times10^{12}$ $cm^{-2}$ to about $5\times10^{14}$ $cm^{-2}$ (e.g., about $1\times10^{14}$ $cm^{-2}$). The two doping steps may be performed successively in the same doping chamber.

In the first doping step, a high concentration of phosphorus is implanted into regions of the semiconductor layers 307n and 307p that are not masked with the gate electrodes 314n/312n and 314p/312p, thereby forming heavily-doped n-type impurity regions 316 and 319. In the second doping step, a low concentration of phosphorus is implanted into regions of the semiconductor layers 307n and 307p where the upper conductive films 314n and 314p of the gate electrode are absent, through the lower conductive films 312n and 312p, thereby forming lightly-doped n-type impurity regions 317 and 320. In the second doping step, phosphorus does not reach regions of the semiconductor layers where the semiconductor layers are masked with the upper conductive films 314n and 314p of the gate electrode, and such regions of the semiconductor layers are not doped. As a result, the region 316 of the semiconductor layer 307n of the n-channel TFT that is doped with a high concentration of phosphorus will later be the source/drain region, and region 317 that is doped with a low concentration of phosphorus will later be the LDD region. Moreover, a region 318n that is masked with the upper conductive film 314n of the gate electrode and is not doped with phosphorus will later be the channel region. At this point, the semiconductor layer 307p of the p-channel TFT is also doped with phosphorus. In the present preferred embodiment, the LDD region 317 is formed so as to overlap the lower portion of the gate electrode. In this way, it is possible to considerably improve the hot carrier resistance and to improve the reliability of the TFT. Moreover, while the doping step with a low acceleration voltage and a high dose for forming a heavily-doped region is performed first in the present preferred embodiment, the doping step for forming a lightly-doped region may alternatively be performed first. Moreover, while the doping process is performed in two separate steps in the present preferred embodiment, it is possible to form the heavily-doped region and the lightly-doped region in a single doping step by appropriately adjusting the acceleration voltage and the dose and utilizing the difference in ion range corresponding to the thickness of the lower conductive film of the gate electrode.

Figure 5C:
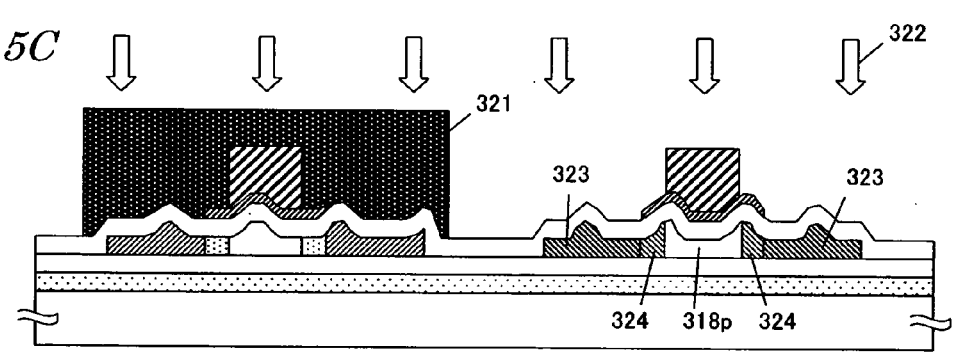

Then, as illustrated in FIG. 5C, a photoresist doping mask 321 is provided so as to cover the entire semiconductor layer 307n of the n-channel TFT. Then, an impurity giving p-type conductivity (boron) 322 is implanted into the semiconductor layer 307p of the p-channel TFT by an ion doping method using the resist mask 321 and the gate electrode 314p/312p of the p-channel TFT as masks. Diborane ($B_2H_6$) is used as the doping gas, the acceleration voltage is set to about 60 kV to about 90 kV (e.g., about 75 kV), and the dose is set to about $5\times10^{15}$ $cm^{-2}$ to about $2\times10^{16}$ $cm^{-2}$ (e.g., about $1\times10^{16}$ $cm^{-2}$). Through this step, a high concentration of boron 322 is implanted into a region 323 of the island-shaped semiconductor layer 307p of the p-channel TFT that is not masked with the lower conductive film (TaN film) 312p of the gate electrode so as to cancel the previously-added n-type impurity (phosphorus) and invert the polarity thereof ("counter doping"), and the region 323 will later be the source/drain region of the p-channel TFT. Moreover, in a region 324 over which only the lower conductive film (TaN film) 211p of the gate electrode is present, the doping ion range is extended by the thickness of the TaN film, and the amount of boron to be actually implanted into the region 324 is smaller than in the source/drain regions 323, whereby the region 324 will later be the LDD region of the p-channel TFT. Moreover, a region 318p that is covered with the upper conductive film (W film) 314p of the gate electrode and is not doped with boron will later be the channel region of the p-channel TFT. Moreover, the doping process may be performed in two separate steps using different acceleration voltages for the source/drain region and for the LDD region. In this process, the semiconductor layer 307n of the n-channel TFT, which is entirely covered with the mask 321, is not at all doped with boron 322. Thus, an n-channel TFT and a p-channel TFT can be produced together.

As described above, an n-type impurity and a p-type impurity are implanted while each region that does not need to be doped with the impurity is covered with a photoresist, whereby the impurity elements are selectively implanted to form an n-type impurity region and a p-type impurity region. Note that n-type and p-type impurity elements are preferably added in this order to the semiconductor layer in the present preferred embodiment, the order is not limited to this but may be determined appropriately for each specific application.

Figure 5D:
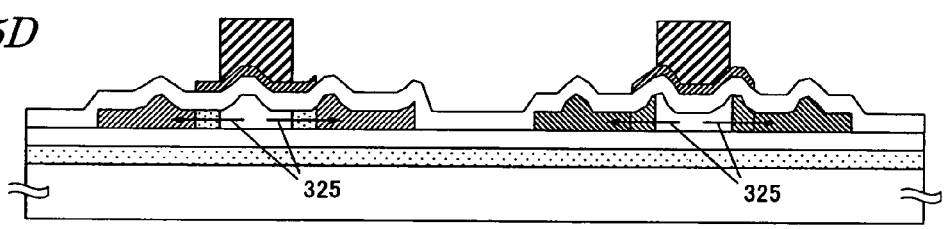

Then, after the resist mask 321 is removed, a second heat treatment is performed in an inert atmosphere (e.g., a nitrogen atmosphere). In the present preferred embodiment, the heat treatment is performed at about 520° C. to about 600° C. for about 30 minutes to about 8 hours. In this heat treatment step, phosphorus implanted into the source/drain region in each of the semiconductor layer 307n of the n-channel TFT and the semiconductor layer 307p of the p-channel TFT increases the solid solubility of the region for nickel, so that nickel is moved from the channel regions 318n and 318p to the LDD regions 317 and 324 and then into the source/drain regions 316 and 323 as indicated by arrow 325, thereby performing a gettering process, as illustrated in FIG. 5D.

In the gettering process, first, nickel present in the form of solid solution in the channel regions 318n and 318p and the LDD regions 317 and 324 is moved into the source/drain regions 316 and 323. As a result, the nickel concentration is decreased in the channel regions, whereby Ni silicide masses remaining therein start dissolving in the channel regions. Then, the newly dissolved Ni atoms are also moved into the source/drain regions 316 and 323. Eventually, Ni silicide masses are removed from the channel regions, and the concentration of solid-solution nickel is also reduced. As a result, since nickel is moving into the source/drain regions 316 and 323, the nickel concentration is about $1\times10^{19}/cm^3$ or more in the source/drain regions 316 and 323.

This heat treatment step also activates the n-type impurity (phosphorus) doped into the source/drain region 316 and the LDD region 317 of the n-channel TFT and the p-type impurity (boron) doped into the source/drain region 323 and the LDD region 324 of the p-channel TFT. As a result, the sheet resistance value of the source/drain region 316 of the n-channel TFT was about 500 Ω/square to about 800 Ω/square, and the sheet resistance value of the source/drain region 323 of the p-channel TFT was about 1 kΩ/square to about 1.5 kΩ/square. Moreover, the sheet resistance value of the LDD region 317 of the n-channel TFT was about 30 kΩ/square to about 50 kΩ/square, and the sheet resistance value of the LDD region 324 of the p-channel TFT was about 10 Ω/square to about 20 kΩ/square.

Figure 5E:
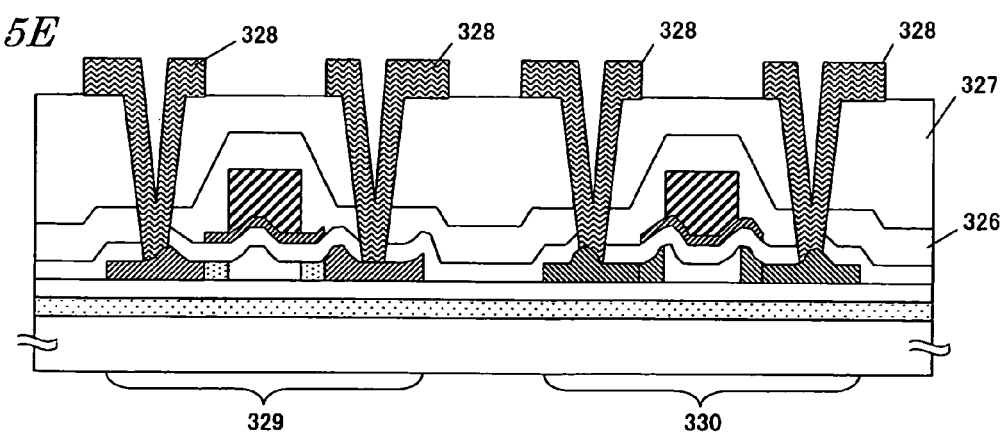

Then, as illustrated in FIG. 5E, an interlayer insulating film is formed. A silicon nitride film, a silicon oxide film or a silicon nitride oxide film is formed to a thickness of about 400 nm to about 1500 nm (typically, about 600 nm to about 1000 nm). In the present preferred embodiment, a silicon nitride film 326 having a thickness of about 200 nm and a silicon oxide film 327 having a thickness of about 700 nm were deposited on one another, thereby providing a two-layer film. The deposition process is performed by a plasma CVD method to continuously form the silicon nitride film using $SiH_4$ and $NH_3$ as material gases, and the silicon oxide film using TEOS and $O_2$ as material gases. Needless to say, the inorganic interlayer insulating film may alternatively be any other suitable silicon-containing insulating film and may be a single-layer film or a multi-layer film.

Then, another heat treatment is performed at about 300° C. to about 500° C. for 1 to several hours as a step of hydrogenating the semiconductor layer. This step is performed for terminating and inactivating dangling bonds that deteriorate the TFT characteristics by supplying hydrogen atoms to the interface between the active region and the gate insulating film. In the present preferred embodiment, a heat treatment was performed in a nitrogen atmosphere containing about 3% of hydrogen at about 410° C. for approximately 1 hour. When a sufficient amount of hydrogen is contained in the interlayer insulating film (particularly the silicon nitride film 326), the effect can be obtained also by performing the heat treatment in a nitrogen atmosphere. Other hydrogenation processes that can be used include a plasma hydrogenation process (using hydrogen excited by plasma).

Then, contact holes are made in the interlayer insulating film, and an electrode/line 328 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel thin film transistor (TFT) 329 and a p-channel thin film transistor (TFT) 330 as illustrated in FIG. 5E. As necessary, additional contact holes may be made over the gate electrodes 314n and 314p for providing necessary connection between electrodes with the line 328. Moreover, a protection film made of silicon nitride, or other suitable material like, may be further provided on each TFT for the purpose of protecting the TFT.

An n-channel TFT and a p-channel TFT produced according to the preferred embodiment as described above exhibited very desirable characteristics with high field-effect mobilities of about 250 $cm^2$/Vs to about 30 $cm^2$/Vs and about 120 $cm^2$/Vs to about 15 $cm^2$/Vs, respectively, and with threshold voltages of about 1 V and about −1.5 V, respectively. Moreover, these TFTs exhibited substantially no abnormal increase in the TFT off-state leak current, which frequently occurs in the prior art, and substantially no characteristics deterioration was observed in tests for determining the resistance to repeated operations, the resistance to bias voltages and the resistance to thermal stresses.

Moreover, as a CMOS circuit having a complementary set of an n-channel TFT and a p-channel TFT produced according to the present preferred embodiment was used in various circuits such as an inverter chain and a ring oscillator, the circuits exhibited a much higher reliability and more stable circuit characteristics as compared to the prior art.

Moreover, TFTs produced according to the present preferred embodiment included very few defective TFTs with an abnormal leak current, with the defect rate being on the order of about 0.0001%.

Fourth Preferred Embodiment

A semiconductor device according to the fourth preferred embodiment of the present invention and a method for manufacturing the same will now be described. The present preferred embodiment is also directed to a process of producing, on a glass substrate, a circuit having a CMOS structure including a complementary set of an n-channel TFT and a p-channel TFT.

FIG. 6A to FIG. 6G and FIG. 7A to FIG. 7E are cross-sectional views sequentially illustrating steps for producing the TFTs of the present preferred embodiment.

Figure 6A:
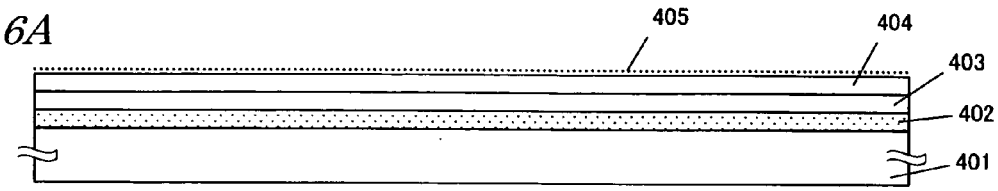
FIG. 6A to FIG. 6G are schematic cross-sectional views illustrating steps for manufacturing a semiconductor device according to a fourth preferred embodiment of the present invention.

Referring to FIG. 6A, a base film such as a silicon oxide film, a silicon nitride film or a silicon oxide nitride film is formed on the TFT side of a low-alkali glass substrate 401 for preventing the diffusion of an impurity from the substrate 401. In the present preferred embodiment, a silicon nitride film was deposited as a lower first base film 402, and a silicon oxide film was deposited as a second base film 403 on the first base film 402. The silicon oxide nitride films of the first base film 402 and the second base film 403 were formed successively by a plasma CVD method both to a thickness of about 100 nm, for example. Then, an amorphous silicon film (a-Si film) 404 having a thickness of about 20 nm to about 100 nm (e.g., about 50 nm) is formed. The base films 402 and 403 and the a-Si film 404 may be formed successively.

Then, a small amount of a catalyst element (nickel in the present preferred embodiment) 406 is added to the surface of the a-Si film 404. The addition of a small amount of nickel 406 was performed by holding a nickel solution on the a-Si film 404, uniformly spreading the solution across the substrate 401 by a spinner, and then drying the substrate 401. In the present preferred embodiment, nickel acetate was preferably used as the solute, water was preferably used as the solvent, and the nickel concentration in the solution was controlled to be about 8 ppm. This state is shown in FIG. 6A. The concentration of added nickel on the surface of the a-Si film 404 in the state as illustrated in FIG. 6A was about $4 \times 10^{12}$ atoms/$cm^2$, as measured by a total reflection X-ray fluorescence (TRXRF) method.

Figure 6B:
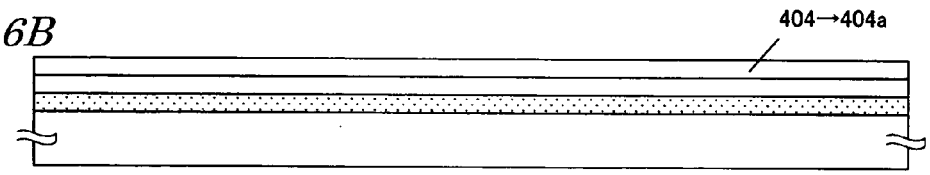

Then, a heat treatment is performed in an inert atmosphere (e.g., a nitrogen atmosphere). The heat treatment is performed at about 520° C. to about 600° C. for approximately 1 to 8 hours. In the present preferred embodiment, the heat treatment was performed at about 550° C. for approximately 4 hours. In this heat treatment, nickel 406 added to the surface of the a-Si film 404 diffuses into the a-Si film 404 while being silicified, and the crystallization of the a-Si film 404 proceeds using the silicide as nuclei. As a result, the a-Si film 404 is crystallized into a crystalline silicon film 404a, as illustrated in FIG. 6B. In the obtained crystalline silicon film 404a, the orientated crystal planes are primarily planes of <111> crystal zone, and about 50% or more of the regions that are oriented along the <111> crystal zone planes are regions that are oriented along the (110) plane or the (211)

plane. Moreover, the crystal domains (regions each having a substantially uniform orientation) of the obtained crystalline silicon film 404a have domain diameters of about 2 μm to about 10 μm.

Figure 6C:
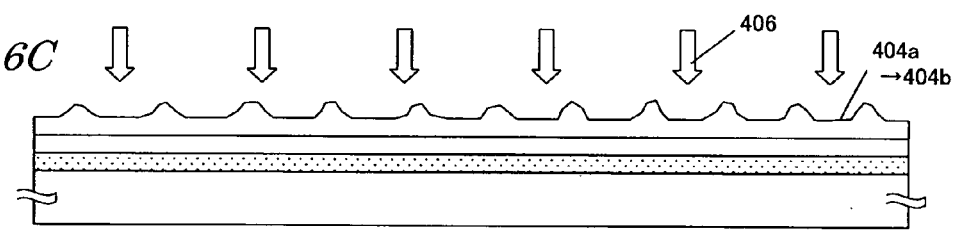

Then, as illustrated in FIG. 6C, the crystalline silicon film 404a is irradiated with laser light 407 to further crystallize the crystalline silicon film 404a, thereby improving the crystallinity thereof. In this step, XeCl excimer laser (wavelength: 308 nm, pulse width: 40 nsec) was used as the laser light. The laser light irradiation was performed with an energy density of about 400 mJ/cm$^2$. The laser light was shaped so as to form an elongated beam spot having a size of about 150 mm by about 1 mm, and the substrate was scanned in the direction that is substantially perpendicular to the longitudinal direction of the beam spot and in a line sequential manner with a step width of about 0.05 mm. Thus, any point on the crystalline silicon film 404a is irradiated with laser light a total of 20 times. The crystalline silicon film 404a obtained by solid-phase crystallization as described above is turned into a crystalline silicon film 404b of a higher quality as the crystal defects are reduced through the melting/solidification process by the laser irradiation. After the laser irradiation process, the crystal orientation of the obtained crystalline silicon film 404b remains to be that of the crystalline silicon film 404a before the laser irradiation. However, ridges have been formed through the melting/solidification process by laser irradiation on the surface of the crystalline silicon film 404b with an average surface roughness Ra of about 4 nm to about 9 nm. The inclination angle of the protruding portions (ridges) in the surface irregularities of the crystalline silicon film 404b is preferably about 30° to about 70° (about 45° in the present preferred embodiment).

Figure 6D:
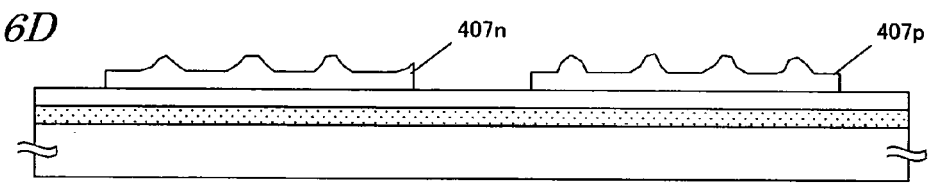

Then, a device isolation process is performed by removing unnecessary portions of the crystalline silicon film 404b. Through this step, island-shaped crystalline silicon films 407n and 407p are formed, as illustrated in FIG. 6D. The island-shaped crystalline silicon films 407n and 407p will later be the semiconductor layers (the source/drain regions and the channel regions) of the n-channel TFT and the p-channel TFT, respectively.

Boron (B) may be added, as an impurity element giving p-type conductivity, to the entire surface of the semiconductor layers of the n-channel TFT and the p-channel TFT at a concentration of about $1\times10^{16}$/cm$^3$ to about $5\times10^{17}$/cm$^3$ for the purpose of controlling the threshold voltage. Boron (B) may be added by an ion doping method, or may alternatively be added to the amorphous silicon film when the amorphous silicon film is deposited.

Figure 6E:
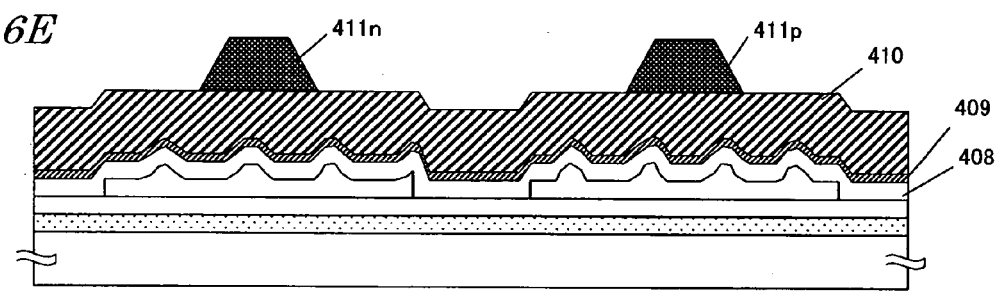

Then, a silicon oxide film having a thickness of about 20 nm to about 150 nm (about 100 nm in the present preferred embodiment) is deposited, as a gate insulating film 408, so as to cover the semiconductor layers 407n and 407p. Then, a conductive film (A) 409 and a conductive film (B) 410 are deposited for forming a gate electrode. In the present preferred embodiment, a tantalum nitride (TaN) film having a thickness of about 30 nm and a tungsten (W) film having a thickness of about 400 nm were formed by a sputtering method as the conductive layer (A) 409 and the conductive layer (B) 410, respectively. Then, resist masks 411n and 411p are formed for forming the gate electrode by a patterning process, as illustrated in FIG. 6E.

Figure 6F:
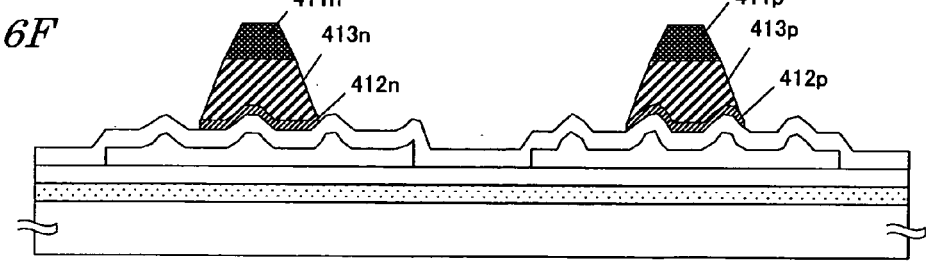

Then, a first etching process is performed for forming the gate electrode and the gate line (scanning line) of each TFT. Also in the present preferred embodiment, a three-step etching process was performed by an ICP (Inductively Coupled Plasma) etching method in a manner similar to that of the third preferred embodiment. First, as illustrated in FIG. 6F, the W film is etched in the first etching process so as to gently taper the edges of conductive layers (B) 413n and 413p. Then, in a second etching process, the conductive film (A) (TaN film) is etched so as to form TaN films 412n and 412p whose edges have side surface inclination angles of about 80° to about 90°.

Figure 6G:
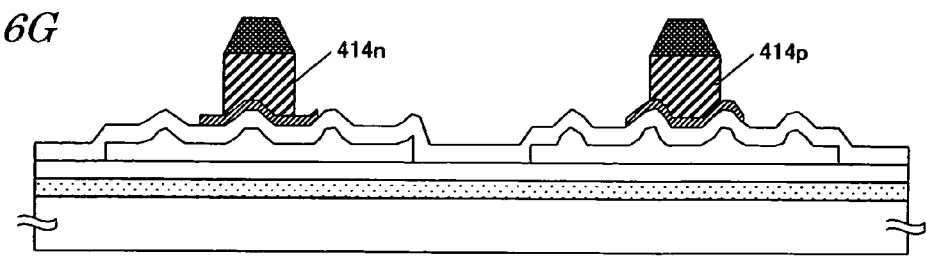

Then, a third etching process is performed so that the W films 413n and 413p are selectively etched with an anisotropy. In this process, the TaN films 312n and 312p are not etched, and only the W films 413n and 413p are etched laterally, thereby forming W films 414n and 414p whose edges have side surface inclination angles of about 80° to about 90°. Thus, gate electrodes 414n/412n and 414p/412p are obtained, as illustrated in FIG. 6G, each having a layered and stepped structure including a W film and a TaN film.

Figure 7A:
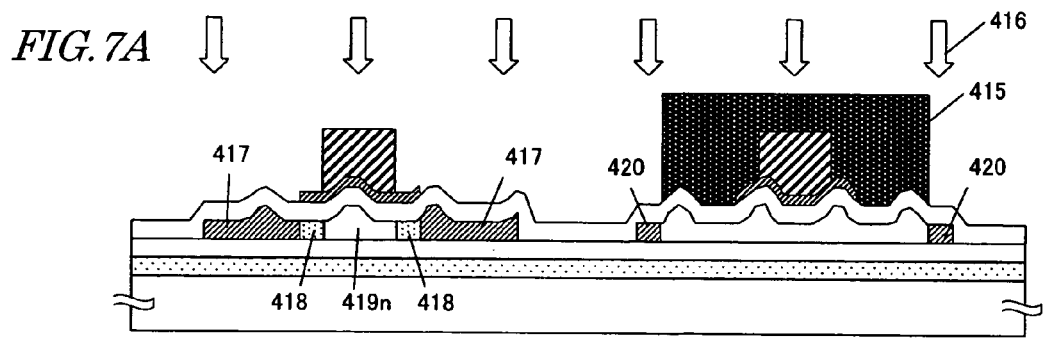
FIG. 7A to FIG. 7E are schematic cross-sectional views illustrating steps for manufacturing a semiconductor device according to the fourth preferred embodiment of the present invention (continued from FIG. 6G).

Then, after the resist masks 411n and 411p are removed, a photoresist doping mask 415 with an even thicker side wall is provided so as to cover the gate electrode 414p/412p in the p-channel TFT, with only a peripheral portion of the semiconductor layer 307p being exposed, as illustrated in FIG. 7A. Then, an n-type impurity (phosphorus) 416 is implanted into the semiconductor layers 407n and 407p by an ion doping method using the gate electrode 414n/412n, which is in a two-layer stepped structure, and the resist mask 415 as masks. Also in the present preferred embodiment, the phosphorus 416 doping process was performed in two separate steps using different acceleration voltages and different doses. The doping process was performed under similar conditions to those of the third preferred embodiment. In the first doping step, a high concentration of phosphorus is implanted into a region of the semiconductor layer 407n of the n-channel TFT that is not masked with the gate electrode 414n/412n, thereby forming a heavily-doped n-type impurity region 417. In the second doping step, phosphorus is implanted through the lower conductive film 412n of the gate electrode into a region where the upper conductive film 414n of the gate electrode is absent, thereby forming a lightly-doped n-type impurity region 418. In the second doping step, phosphorus does not reach regions of the semiconductor layers where the semiconductor layers are masked with the upper conductive film 414n of the gate electrode, and such regions of the semiconductor layers are not doped. As a result, in the semiconductor layer 407n of the n-channel TFT, a portion of the region 417 that is heavily doped with phosphorus will later be the source/drain region, and a region 418 that is lightly doped with phosphorus will later be the LDD region. Moreover, a region 419n that is masked with the upper conductive film 414n of the gate electrode and is not doped with phosphorus will later be the channel region. On the other hand, in the semiconductor layer 407p of the p-channel TFT, a region that is covered with the resist mask 415 is not doped with phosphorus, and only a region 420 that is not masked with the resist mask 415 is doped with phosphorus. Through this step, the region 420 of the semiconductor layer of the p-channel TFT that is heavily doped with phosphorus will later be the gettering region of the p-channel TFT. The concentration of the n-type impurity element (phosphorus) in the regions 417 and 420 is about $1\times10^{19}$/cm$^3$ to about $1\times10^{21}$/cm$^3$. Moreover, the concentration of the n-type impurity element (phosphorus) in the LDD region 418 of the n-channel TFT is in the range of about $1\times10^{17}$/cm$^3$ to about $1\times10^{20}$/cm$^3$, within which the region functions as an LDD region.

Then, after the photoresist mask 415 is removed, the lower conductive films (TaN films) 412n and 412p are etched using the upper conductive films (W films) 414n and

Figure 7B:
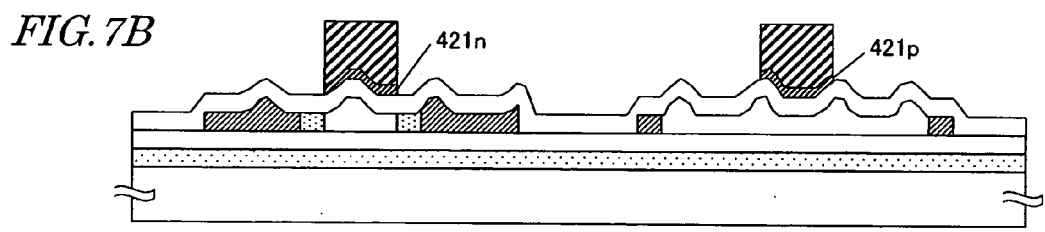

414p of the gate electrode as masks. The etching process was performed for about 30 seconds by an ICP etching method using etching gases of $CF_4$ and $Cl_2$ at a flow rate ratio of 30/30 (sccm) and by creating a plasma by supplying an RF (13.56 MHz) power of 500 W through a coil electrode at a pressure of 1 Pa. Also to the substrate, an RF (13.56 MHz) power of 20 W is supplied, thereby substantially applying a negative self-bias voltage. Thus, only portions of the TaN films 412n and 412p that are not masked with the W films 414n and 414p are selectively etched away. After the etching process, TaN films 421n and 421p are formed whose edges have side surface inclination angles of about 80° to about 90°. This state is shown in FIG. 7B. Thus, in the semiconductor layer 407n of the n-channel TFT, the LDD region 418 formed in the previous step is located outside the gate electrode. Such a structure is particularly effective in suppressing the TFT off-state leak current.

Figure 7C:
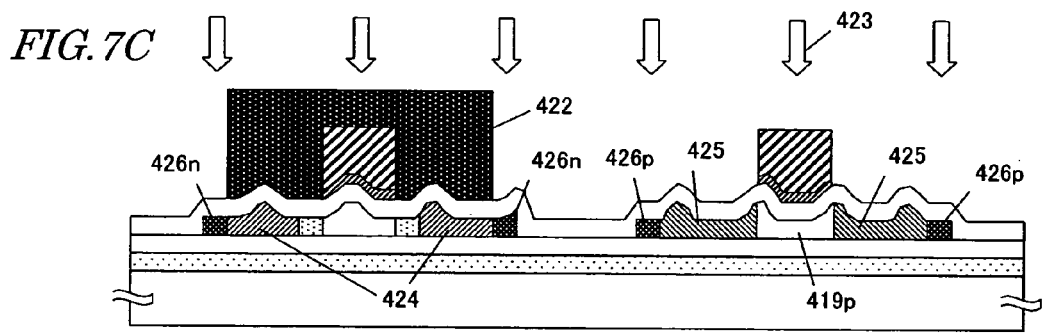
Figure 7D:
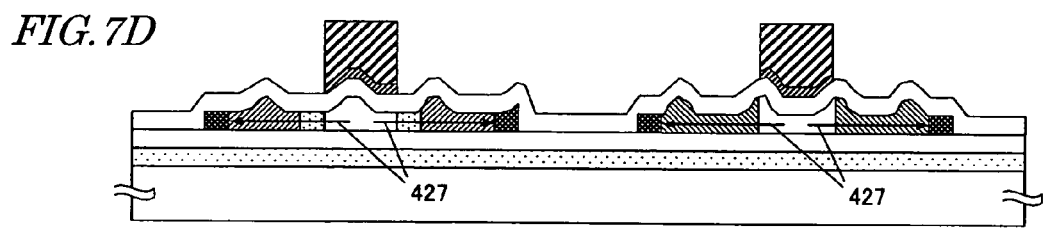

Then, another photoresist doping mask 422 with a thick side wall is provided over the semiconductor layer 407n of the n-channel TFT so as to cover the previously-formed LDD region 418, with only a peripheral portion of the semiconductor layer 407n being exposed, as illustrated in FIG. 7C. At this time, no mask is provided over the semiconductor layer 407p of the p-channel TFT, whereby the TFT is entirely exposed. Then, an impurity giving p-type conductivity (boron) 423 is implanted into the semiconductor layers by an ion doping method using the resist mask 422 and the gate electrode 414p/421p of the p-channel TFT as masks. Diborane ($B_2H_6$) is used as the doping gas, the acceleration voltage is set to about 40 kV to about 80 kV (e.g., about 65 kV), and the dose is set to about $1 \times 10^{15}$ cm$^{-2}$ to about $1 \times 10^{16}$ cm$^{-2}$ (e.g., about $7 \times 10^{15}$ cm$^{-2}$). Through this step, a region 426n of the n-channel TFT that is heavily doped with boron functions as the gettering region of the n-channel TFT, and the remainder 424 of the region that is highly doped with phosphorus in the previous step functions as the source/drain region. In the semiconductor layer 407p of the p-channel TFT, a high concentration of boron is implanted into a region other than a channel region 419p under the gate electrode 414p/421p, and a doped region 425 will later be the source/drain region of the p-channel TFT. Moreover, the region 420, which has been doped with a high concentration of phosphorus, is doped with an even higher concentration of boron, thereby forming a gettering region 426p of the p-channel TFT. The concentration of the p-type impurity element (boron) in the region 425 and the regions 426n and 426p is about $1.5 \times 10^{19}$/cm$^3$ to about $3 \times 10^{21}$/cm$^3$. The gettering region 426n of the n-channel TFT and the gettering region 426p of the p-channel TFT are regions that have been doped with phosphorus 416 (in the previous step) and with boron 423 (in the current step).

Then, after the resist mask 422 is removed, a heat treatment is performed in an inert atmosphere (e.g., a nitrogen atmosphere). In the present preferred embodiment, an RTA (Rapid Thermal Annealing) process was used. The RTA apparatus used was an apparatus capable of performing an annealing process in a nitrogen atmosphere while rapidly increasing and decreasing the temperature by blowing a high-temperature nitrogen gas onto the surface of the substrate. Specifically, the substrate is held at about 550° C. to 750° C. for about 30 seconds to 15 minutes, more preferably at about 600° C. to about 700° C. for about 1 to 10 minutes. In the present preferred embodiment, an RTA process was performed at about 670° C. for approximately 5 minutes. The temperature-increasing rate and the temperature-decreasing rate are preferably about 100° C./min or more (about 200° C./min in the present preferred embodiment). In this heat treatment step, phosphorus and boron doped at high concentrations into the gettering region 426n formed outside the source/drain region in the semiconductor layer 407n of the n-channel TFT increase the solid solubility of the region for nickel, and also form segregation sites for nickel. Moreover, crystal defects created during the doping process also function as segregation sites for nickel. Then, nickel present in the channel region 419n, the LDD region 418 and the source/drain region 424 is moved from the channel region to the LDD region, the source/drain region and to the gettering region 426n as indicated by arrow 427 in FIG. 7D. Although the source/drain region 424 doped only with phosphorus has a gettering effect, the gettering capability of the gettering region 426n doped with phosphorus and boron is higher, whereby nickel is collected into the gettering region 426n. Also in the semiconductor layer 407p of the p-channel TFT, phosphorus and boron doped at high concentrations into the gettering region 426p formed outside the source/drain region provide a similar function, whereby nickel present in the channel region 419p and the source/drain region 425 is moved from the channel region to the source/drain region and to the gettering region 426p as indicated by arrow 427. Thus, the gettering process is performed.

Since nickel is moving into the gettering regions 426n and 426p in the gettering process, the nickel concentration is about $1 \times 10^{19}$/cm$^3$ or more in the gettering regions 426n and 426p.

This heat treatment step also activates the n-type impurity (phosphorus) doped into the source/drain region 424 and the LDD region 418 of the n-channel TFT and the p-type impurity (boron) doped into the source/drain region 425 of the p-channel TFT. As a result, the sheet resistance value of the source/drain region 424 of the n-channel TFT was about 400 Ω/square to about 700 Ω/square, and the sheet resistance value of the LDD region 418 was about 30 kΩ/square to about 60 kΩ/square. Moreover, the sheet resistance value of the source/drain region 425 of the p-channel TFT was about 0.7 kΩ/square to about 1.0 kΩ/square. With the structure of the present preferred embodiment, it was possible to eliminate counter doping in the p-channel TFT, thereby reducing the resistance of the source/drain region of the p-channel TFT and improving the doping capability.

Figure 7E:
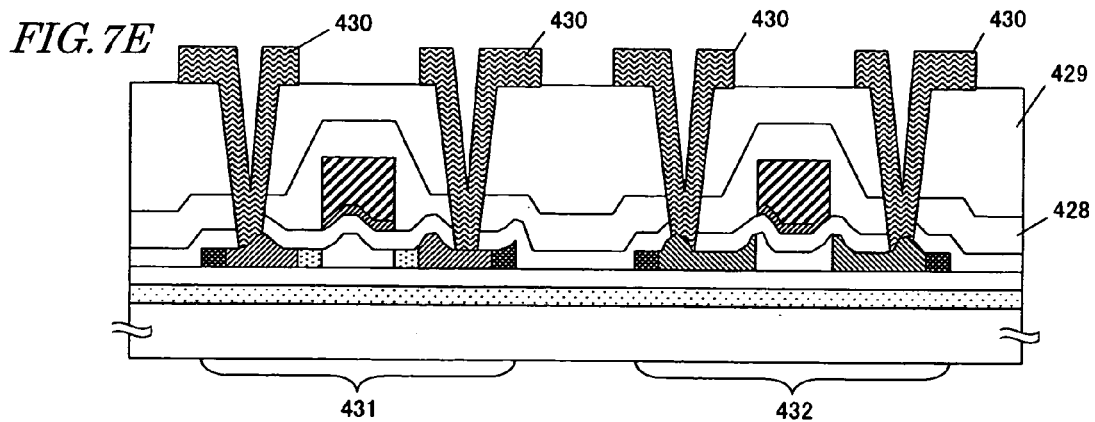

Then, as illustrated in FIG. 7E, an interlayer insulating film is formed. In the present preferred embodiment, a silicon nitride film 428 having a thickness of about 200 nm and a silicon oxide film 429 having a thickness of about 700 nm were deposited on one another, thereby providing a two-layer film. Needless to say, the inorganic interlayer insulating film may alternatively be any other suitable silicon-containing insulating film and may be a single-layer film or a multi-layer film.

Then, another heat treatment is performed at about 300° C. to about 500° C. for about 1 hour. This is performed for terminating and inactivating dangling bonds that deteriorate the TFT characteristics by supplying hydrogen atoms to the interface between the active region and the gate insulating film from the interlayer insulating film (particularly the silicon nitride film 428).

Then, contact holes are made in the interlayer insulating film, and an electrode/line 430 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel thin film transistor (TFT) 331 and a p-channel thin film transistor (TFT) 332 as illustrated in FIG. 7E. As necessary, additional contact holes may be made over the gate electrodes 421n and 421p for providing necessary connection between electrodes with the line 430. Moreover, a protection film made of silicon nitride, or other suitable material, may be further provided on each TFT for the purpose of protecting the TFT.

Each TFT produced according to the present preferred embodiment exhibits a desirable field-effect mobility as in the third preferred embodiment.

Furthermore, in the present preferred embodiment, the LDD region of the n-channel TFT can be formed outside the gate electrode, which is more effective in reducing the off-state current. Moreover, the gettering region can be formed in the source/drain region formation step for each of the n-channel TFT and the p-channel TFT. Therefore, it is possible to simplify the manufacturing process while reducing the manufacturing cost of the semiconductor device and improving the production yield.

Moreover, TFTs produced according to the present preferred embodiment included very few defective TFTs with an abnormal leak current, with the defect rate being on the order of about 0.0001%.

Fifth Preferred Embodiment

The present preferred embodiment is directed to a crystallization method using a catalyst element that is different from those of the third or fourth preferred embodiment. The present preferred embodiment will be described with reference to FIG. 8A to FIG. 8E. FIG. 8A to FIG. 8E are cross-sectional views sequentially illustrating the manufacturing steps of the present preferred embodiment.

First, as in the first to fourth preferred embodiments, a base film such as a silicon oxide film, a silicon nitride film or a silicon oxide nitride film is formed on a substrate (a glass substrate in the present preferred embodiment) 501 for preventing the diffusion of an impurity from the substrate 501. In the present preferred embodiment, a silicon nitride film was deposited as a lower first base film 502, and a silicon oxide film was deposited as a second base film 503 on the first base film 502. Then, an a-Si film 504 is formed to a thickness of about 30 nm to about 80 nm by a method similar to those of the first to fourth preferred embodiments. In this step, the base insulating films and the amorphous semiconductor film may be formed successively without exposing the substrate to the atmospheric air.

Figure 8A:
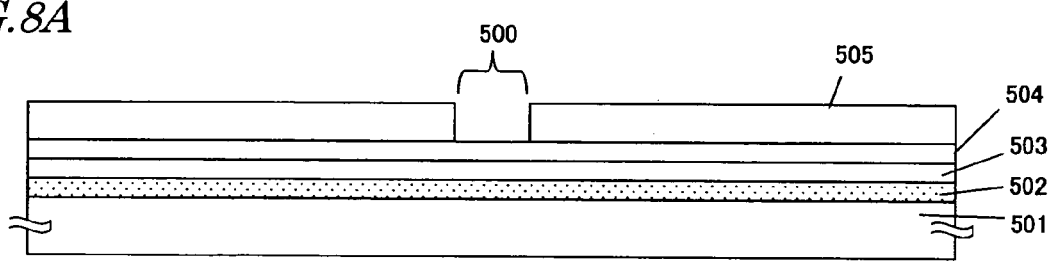
FIG. 8A to FIG. 8E are schematic cross-sectional views illustrating steps for manufacturing a semiconductor device according to a fifth preferred embodiment of the present invention.

Then, a mask insulating film 505 made of silicon oxide is formed to a thickness of about 200 nm. The mask insulating film 505 includes an opening 500 through which a catalyst element is added to the semiconductor film, as illustrated in FIG. 8A.

Figure 8B:
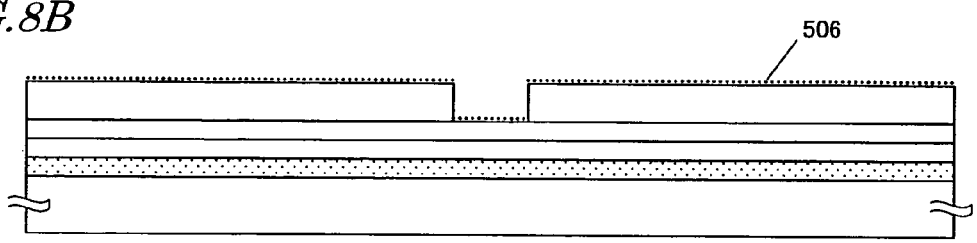

Then, as illustrated in FIG. 8B, an aqueous solution (aqueous nickel acetate solution) containing about 100 ppm by weight of a catalyst element (nickel in the present preferred embodiment) is applied by a spin coating method, thereby forming a catalyst element layer 506. In this step, the catalyst element 506 selectively contacts the a-Si film 504 in the opening 500 of the mask insulating film 505, thereby forming a catalyst-element-added region.

Moreover, while nickel is added by a spin coating method in the present preferred embodiment, a thin film of a catalyst element (nickel film in the present preferred embodiment) may alternatively be formed on an a-Si film by a vapor deposition method, a sputtering method, or other suitable process.

Figure 8C:
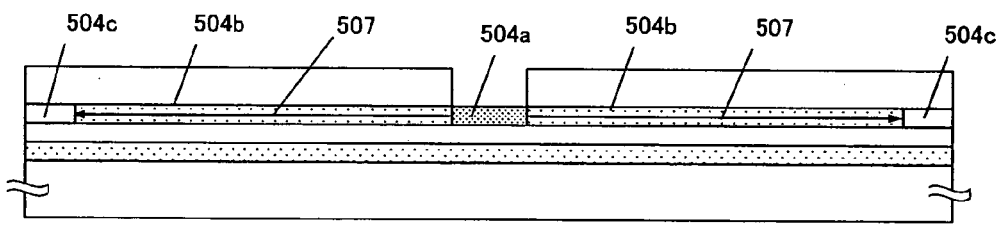

Then, a heat treatment is performed at about 500° C. to about 650° C. (preferably about 550° C. to about 600° C.) for approximately 6 to 20 hours (preferably approximately 8 to 15 hours). In the present preferred embodiment, a heat treatment is performed at about 580° C. for approximately 10 hours. As a result, as illustrated in FIG. 8C, crystal nuclei are formed in the catalyst-element-added region 500, and the a-Si film in the region 500 is first crystallized into a crystalline silicon film 504a. Starting from the crystallized region, the crystallization further proceeds in a direction generally parallel to the substrate (as indicated by arrow 507), thereby forming a crystalline silicon film 504b where the crystal growth direction is uniform macroscopically. In this step, nickel 506 present above the mask 505 is blocked by the mask film 505 and does not reach the underlying a-Si film. Therefore, the crystallization of the a-Si film 504 is effected only by nickel that is introduced in the region 500. Moreover, the region to which the lateral growth frontline does not reach is left as an amorphous region 504c. Depending on the layout, however, two laterally-grown crystal regions coming from adjacent openings may collide with each other to form a boundary therebetween, in which case such an amorphous region may not be present.

Figure 8D:
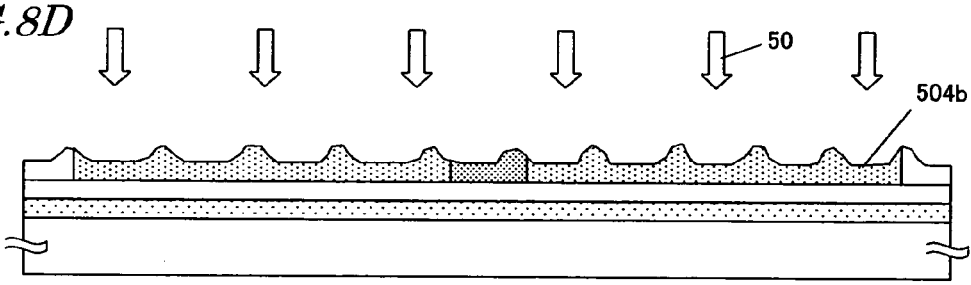
Figure 8E:
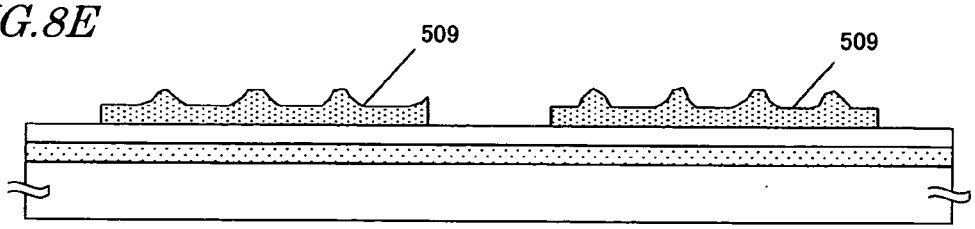

After the silicon oxide film 505, used as a mask, is removed, the obtained crystalline silicon film may be irradiated with laser light as illustrated in FIG. 8D so as to improve the crystallinity as in the third or fourth preferred embodiment. Thus, the crystalline silicon film in the laterally-grown crystal region 504b is further improved in quality and forms a crystalline silicon film 504d. At this point, surface irregularities have been formed on the crystalline silicon film 504b, as in the third or fourth preferred embodiment.

Then, the crystalline silicon film in the laterally-grown crystal region 504d is etched into a predetermined pattern, thereby forming a semiconductor layer 509 of the TFT.

The crystallization method of the present preferred embodiment may be applied to the crystallization step of the first to fourth preferred embodiments so as to realize a TFT having a higher current driving power and a higher performance.

Sixth Preferred Embodiment

Figure 9A:
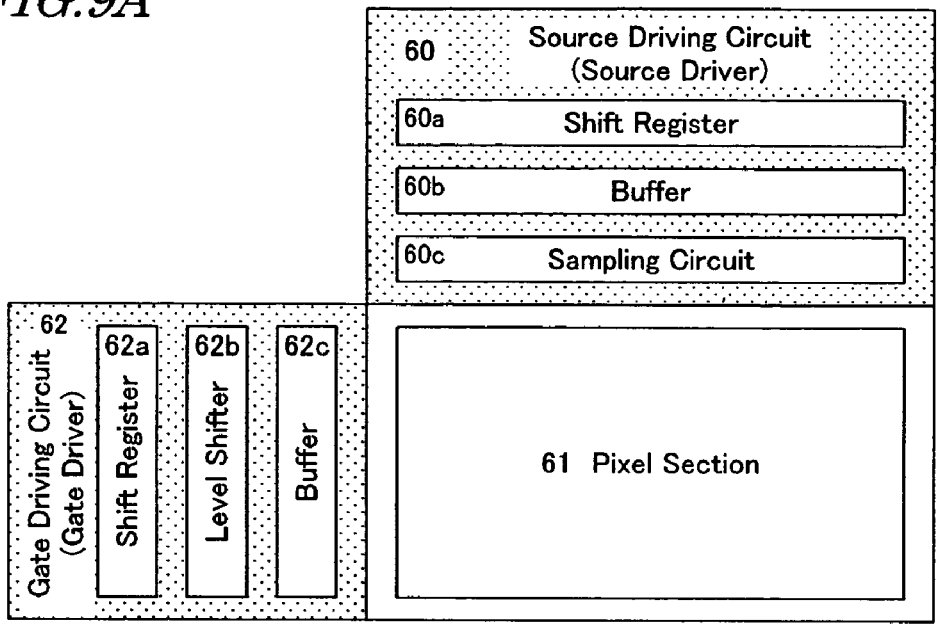
FIG. 9A and FIG. 9B are block diagrams each illustrating a semiconductor device according to a sixth preferred embodiment of the present invention.
Figure 9B:
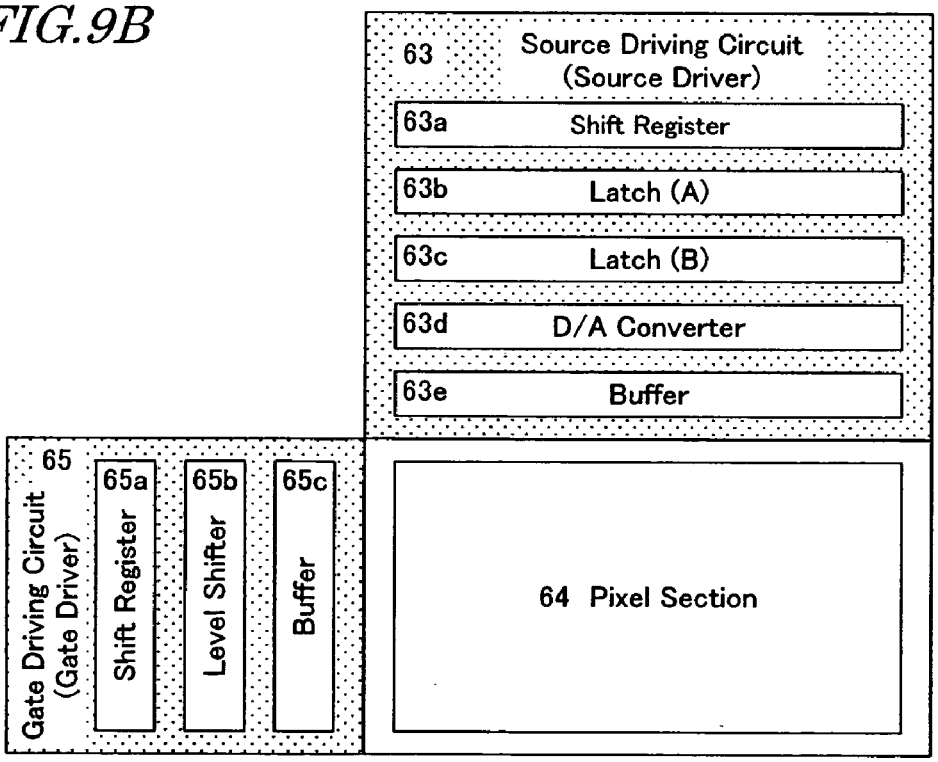

FIG. 9A and FIG. 9B are block diagrams each illustrating a semiconductor device produced according to the first to fifth preferred embodiments of the present invention. Note that FIG. 9A shows a circuit configuration for analog driving. The semiconductor device of the present preferred embodiment includes a source driving circuit 60, a pixel section 61 and a gate driving circuit 62. Note that the term "driving circuit" as used herein is a generic term encompassing a source driving circuit and a gate driving circuit.

The source driving circuit 60 includes a shift register 60a, a buffer 60b and the sampling circuit (transfer gate) 60c. The gate driving circuit 62 includes a shift register 62a, a level shifter 62b and a buffer 62c. As necessary, a level shifter circuit may be provided between the sampling circuit and the shift register.

Moreover, in the present preferred embodiment, the pixel section 61 includes a plurality of pixels, each including a TFT element.

Note that a further gate driving circuit (not shown) may alternatively be provided on the other side of the pixel section 61 from the gate driving circuit 62.

FIG. 9B shows a circuit configuration for digital driving. The semiconductor device of the present preferred embodiment includes a source driving circuit 63, a pixel section 64 and a gate driving circuit 65. For digital driving, a latch (A)

63b and a latch (B) 63c can be provided instead of the sampling circuit, as illustrated in FIG. 9B. A source driving circuit 63 includes a shift register 63a, the latch (A) 63b, the latch (B) 63c, a D/A converter 63d and a buffer 63e. The gate driving circuit 65 includes a shift register 65a, a level shifter 65b and a buffer 65c. As necessary, a level shifter circuit may be provided between the latch (B) 63c and the D/A converter 63d.

The configurations described above can be realized by the manufacturing processes of the first to fifth preferred embodiments above. Although only the pixel section and the driving circuit are illustrated in the present preferred embodiment, a memory or a microprocessor can also be formed by a similar method.

Seventh Preferred Embodiment

A CMOS circuit and a pixel section produced according to the preferred embodiments described above can be used in an active matrix liquid crystal display device or an organic EL display device. Thus, the present invention can be used with any electronic devices incorporating such a liquid crystal display device or organic EL display device in its display section.

Such electronic devices include a video camera, a digital camera, a projector (of a rear type or a front type), a head mounted display (a goggle type display), a personal computer, a portable information terminal (e.g., a mobile computer, a portable telephone, or an electronic book), etc.

With the present invention, it is possible to form a crystalline semiconductor film having a desirable crystallinity using a catalyst element. Moreover, the catalyst element can be gettered sufficiently, whereby it is possible to improve the characteristics of an n-channel TFT and a p-channel TFT, thus realizing a desirable CMOS driving circuit having a high reliability and stable circuit characteristics. Moreover, even with those TFTs whose off-state leak current has been a problem, including a pixel switching TFT and a TFT of a sampling circuit of an analog switch section, it is possible to sufficiently suppress the leak current, which is believed to be due to the segregation of the catalyst element. As a result, it is possible to realize a desirable display with no display non-uniformity. As a desirable display with no display non-uniformity is obtained, it is possible to save the use of the light source and thus the power consumption. Therefore, it is possible to realize an electronic device (such as a portable telephone, a portable electronic book and a display) with a reduced power consumption.

As described above, the present invention can be used in a wide variety of applications, and can be used in any kind of electronic devices. Moreover, an electronic device of the seventh preferred embodiment can be realized by using a display device that is produced based on one or more of the first to sixth preferred embodiments.

The present invention is not limited to those preferred embodiments specifically set forth above, but various modifications can be made based on the technical concept of the present invention.

For example, the semiconductor film of the present invention is not limited to a pure silicon film as used in the preferred embodiments above, but may alternatively be a mixed film of germanium and silicon (a silicon-germanium film) or a pure germanium film.

Moreover, the step of melting/solidifying, and thus crystallizing or recrystallizing, a semiconductor film may alternatively be done with a high-intensity light other than laser light or a energy beam, and continuously oscillating laser such as solid-state YAG laser or Ar gas laser may be used instead of pulsed laser. Moreover, the irradiation conditions are not limited to those shown above, but may be determined appropriately for each specific application in light of the preferred embodiments described above.

Moreover, the gate electrode may alternatively have a layered structure including three or more layers, and the etching method for forming the gate electrode may alternatively be an ordinary plasma etching method, instead of an RIE method or an ICP etching method, under certain conditions. The etching conditions are not limited to those of the preferred embodiments above, but may be determined appropriately for each specific application.

With the present invention, it is possible to realize a semiconductor device in which a crystalline semiconductor film having protruding portions on the surface thereof is used as the semiconductor layer, and in which an abnormal increase in the TFT off-state leak current is prevented, thereby stabilizing the off-state characteristics thereof and increasing the reliability thereof. Moreover, the laser irradiation conditions for the crystallization process can be set, without having to take into consideration the surface irregularities of the semiconductor layer, thereby increasing the margin for the laser irradiation conditions. Therefore, it is possible not only to perform the process stably but also to adjust the conditions while focusing solely on the on-state characteristics of the TFT, whereby it is possible to obtain a crystalline semiconductor film of a higher quality and realize a high-performance semiconductor device. Moreover, it is not necessary to provide additional steps for reducing the surface irregularities of the semiconductor layer, as in the prior art, whereby it is possible to significantly improve the production yield in the manufacturing process and to reduce the manufacturing cost of the semiconductor device.

Moreover, also with a semiconductor layer that is obtained through a crystallization process using a catalyst element, it is possible to suppress the adverse influence of the catalyst element, which is likely to remain in the protruding portion on the surface of the semiconductor layer, on the TFT characteristics. Therefore, it is possible to further suppress the occurrence of a leak current and to improve the device reliability, whereby it is possible to realize a high-performance semiconductor element having stable characteristics with little characteristics variations.

Therefore, with the present invention, it is possible to realize a high-performance semiconductor element, and it is possible to obtain a highly-integrated, high-performance semiconductor device with a simple manufacturing process. Particularly, with a liquid crystal display device, the present invention provides an improvement in the switching characteristics of a pixel switching TFT, which is required for active matrix substrates, and an improvement in the performance and the degree of integration, which is required for TFTs of a peripheral driving circuit section. Therefore, in a driver-monolithic active matrix substrate having an active matrix section and a peripheral driving circuit section formed on the same substrate, it is possible to reduce the size of the module, improve the performance thereof, and reduce the cost thereof.

The present invention can be used in various applications such as active matrix liquid crystal display devices, organic EL display devices, contact image sensors, and three-dimensional ICs.

While the present invention has been described with respect to preferred embodiments, it will be apparent to those skilled in the art that the disclosed invention may be modified in numerous ways and may assume many embodiments other than those specifically set out and described above. Accordingly, it is intended that the appended claims cover all modifications of the invention which fall within the true spirit and scope of the invention.

This application is based on Japanese Patent Application No. 2002-371422 filed on Dec. 24, 2002, the entire contents of which are herein incorporated by reference.

What is claimed is:

1. A semiconductor device, comprising:
a thin film transistor including a semiconductor layer that includes a channel region, a source region, and a drain region;
a gate insulating film provided on the semiconductor layer; and
a gate electrode for controlling a conductivity of the channel region; wherein
the gate electrode includes an inclined side surface and a bottom surface which is in contact with a surface of the gate insulating film;
the semiconductor layer is a crystalline semiconductor layer formed through a melting/solidification process;
a surface of the semiconductor layer includes a protruding portion located under the inclined side surface of the gate electrode, the protruding portion being formed through the melting/solidification process;
the surface of the gate insulating film has an uneven surface corresponding to the protruding portion formed on the surface of the semiconductor layer;
a cross-section of the gate electrode includes first and second opposing sides that are parallel to each other and a third side that is not parallel to any other side of the cross-section of the gate electrode;
a side surface inclination angle of the gate electrode is larger than an inclination angle of the protruding portion of the semiconductor layer; and
the side surface inclination angle of the gate electrode is an angle between a bottom portion of the inclined side surface of the gate electrode, which is in contact with the surface of the gate insulating film, and the bottom surface of the gate electrode.

2. The semiconductor device according to claim 1, wherein a surface of the semiconductor layer includes a plurality of protruding portions, and the side surface inclination angle of the gate electrode is larger than an inclination angle of any of the plurality of protruding portions of the semiconductor layer.

3. The semiconductor device according to claim 1, wherein the side surface inclination angle of the gate electrode is about 75° to about 90°.

4. The semiconductor device according to claim 1, wherein the inclination angle of the protruding portion of the semiconductor layer is about 30° to about 70°.

5. The semiconductor device according to claim 1, wherein an average height of the protruding portion is about 8 nm to about 60 nm.

6. The semiconductor device according to claim 1, wherein an average surface roughness of a surface of the semiconductor layer is about 4 nm to about 30 nm.

7. The semiconductor device according to claim 1, wherein the semiconductor layer is formed from a crystalline semiconductor film, and the protruding portion is located over a boundary between crystal grains included in the semiconductor layer.

8. The semiconductor device according to claim 7, wherein the crystal grain boundary is a multipoint where three or more crystal grains meet.

9. The semiconductor device according to claim 7, wherein grain diameters of the crystal grains included in the semiconductor layer are about 100 nm to about 1000 nm.

10. The semiconductor device according to claim 1, wherein at least a portion of the semiconductor layer includes a catalyst element capable of promoting crystallization of an amorphous semiconductor film.

11. The semiconductor device according to claim 10, wherein the catalyst element is one or more element selected from the group consisting of nickel (Ni), iron (Fe), cobalt (Co), tin (Sn), lead (Pb), ruthenium (Ru), rhodium (Rh), palladium (Pd), osmium (Os), iridium (Ir), platinum (Pt), copper (Cu) and gold (Au).

12. The semiconductor device according to claim 1, wherein the semiconductor layer is a crystalline semiconductor film made up primarily of regions that are oriented along <111> crystal zone planes.

13. The semiconductor device according to claim 12, wherein about 50% or more of the regions that are oriented along the <111> crystal zone planes are regions that are oriented along a (110) plane or a (211) plane.

14. The semiconductor device according to claim 1, wherein domain diameters of crystal domains of the semiconductor layer are about 2 µm to about 10 µm.

15. The semiconductor device according to claim 1, wherein a lightly-doped impurity region is provided at a junction between the channel region and the source or drain region of the semiconductor layer.

16. An electronic device, comprising the semiconductor device according to claim 1.

17. The electronic device according to claim 16, further comprising a display section where an image is displayed by using the semiconductor device.

18. A semiconductor device, comprising a thin film transistor including a semiconductor layer that includes a channel region, a source region and a drain region, a gate insulating film provided on the semiconductor layer, and a gate electrode for controlling a conductivity of the channel region, wherein the semiconductor layer includes a protruding portion, a cross-sectional shape of the gate electrode includes a first step portion and a second step portion provided on the first step portion, and a side surface inclination angle of each of the first and second step portions is larger than an inclination angle of the protruding portion of the semiconductor layer.

19. The semiconductor device according to claim 18, wherein the gate electrode includes a first conductive film provided on the gate insulating film and a second conductive film provided on the first conductive film, a width of the first conductive film is larger than that of the second conductive film, and the first and second conductive films form the first and second step portions, respectively.

20. The semiconductor device according to claim 19, wherein the gate electrode is located above the channel region, and only the first conductive film of the gate electrode is present in a lightly-doped impurity region.

21. The semiconductor device according to claim 18, wherein a surface of the semiconductor layer includes a plurality of protruding portions, the side surface inclination of each of the first and second step portions of the gate electrode is larger than an inclination angle of any of the plurality of protruding portions of the semiconductor layer.

22. The semiconductor device according to claim 18, wherein the side surface inclination of each of the first and second step portions of the gate electrode is about 75° to about 90°.

23. The semiconductor device according to claim 18, wherein the inclination angle of the protruding portion of the semiconductor layer is about 30° to about 70°.

24. The semiconductor device according to claim 18, wherein an average height of the protruding portion is about 8 nm to about 60 nm.

25. The semiconductor device according to claim 18, wherein an average surface roughness of a surface of the semiconductor layer is about 4 nm to about 30 nm.

26. The semiconductor device according to claim 18, wherein the semiconductor layer is formed from a crystalline semiconductor film, and the protruding portion is located over a boundary between crystal grains included in the semiconductor layer.

27. The semiconductor device according to claim 26, wherein the crystal grain boundary is a multipoint where three or more crystal grains meet.

28. The semiconductor device according to claim 26, wherein grain diameters of the crystal grains included in the semiconductor layer are about 100 nm to about 1000 nm.

29. The semiconductor device according to claim 18, wherein the semiconductor layer is a crystalline semiconductor layer formed through a melting/solidification process, and the protruding portion is formed through the melting/solidification process.

30. The semiconductor device according to claim 18, wherein at least a portion of the semiconductor layer includes a catalyst element capable of promoting crystallization of an amorphous semiconductor film.

31. The semiconductor device according to claim 30, wherein the catalyst element is one or more element selected from the group consisting of nickel (Ni), iron (Fe), cobalt (Co), tin (Sn), lead (Pb), ruthenium (Ru), rhodium (Rh), palladium (Pd), osmium (Os), iridium (Ir), platinum (Pt), copper (Cu) and gold (Au).

32. The semiconductor device according to claim 18, wherein the semiconductor layer is a crystalline semiconductor film made up primarily of regions that are oriented along <111> crystal zone planes.

33. The semiconductor device according to claim 32, wherein about 50% or more of the regions that are oriented along the <111> crystal zone planes are regions that are oriented along a (110) plane or a (211) plane.

34. The semiconductor device according to claim 18, wherein domain diameters of crystal domains of the semiconductor layer are about 2 μm to about 10 μm.

35. The semiconductor device according to claim 18, wherein a lightly-doped impurity region is provided at a junction between the channel region and the source or drain region of the semiconductor layer.

36. The semiconductor device according to claim 18, wherein the first step portion of the gate electrode is present in a lightly-doped impurity region.

37. An electronic device, comprising the semiconductor device according to claim 18.

38. The electronic device according to claim 37, further comprising a display section where an image is displayed by using the semiconductor device.

* * * * *